(12) United States Patent
Anderson et al.

(10) Patent No.: US 6,789,241 B2
(45) Date of Patent: Sep. 7, 2004

(54) METHODOLOGY FOR DETERMINING THE PLACEMENT OF DECOUPLING CAPACITORS IN A POWER DISTRIBUTION SYSTEM

(75) Inventors: Raymond E. Anderson, Santa Cruz, CA (US); Larry D. Smith, San Jose, CA (US); Sungjun Chun, Austin, TX (US)

(73) Assignee: Sun Microsystems, Inc., Santa Clara, CA (US)

(*) Notice: Subject to any disclaimer, the term of this patent is extended or adjusted under 35 U.S.C. 154(b) by 0 days.

(21) Appl. No.: 10/284,677

(22) Filed: Oct. 31, 2002

(65) Prior Publication Data

US 2004/0088661 A1 May 6, 2004

(51) Int. Cl.[7] .................................................. G06F 9/45
(52) U.S. Cl. .................................... 716/5; 716/4; 716/2
(58) Field of Search ............................... 716/1, 4, 5, 6, 716/2; 703/14, 4, 18, 19

(56) References Cited

U.S. PATENT DOCUMENTS

| | | | |
|---|---|---|---|
| 4,700,317 A | 10/1987 | Watanabe et al. | |
| 4,754,408 A | 6/1988 | Carpenter et al. | |
| 4,805,113 A | 2/1989 | Ishii et al. | |
| 5,016,087 A | 5/1991 | Haug et al. | |
| 5,027,089 A | 6/1991 | Henke | |
| 5,031,111 A | 7/1991 | Chao et al. | |
| 5,068,631 A | 11/1991 | Vince | |
| 5,422,782 A | 6/1995 | Hernandez et al. | |
| 5,490,083 A | 2/1996 | Toyonaga et al. | |
| 5,563,801 A | 10/1996 | Lee et al. | |
| 5,566,083 A | 10/1996 | Fang | |
| 5,754,826 A | 5/1998 | Gamal et al. | |
| 5,781,446 A | 7/1998 | Wu | |
| 5,796,986 A | 8/1998 | Fuller | |
| 5,798,567 A | 8/1998 | Kelly et al. | |
| 5,883,814 A | 3/1999 | Luk et al. | |
| 5,898,576 A | 4/1999 | Lockwood et al. | |
| 5,905,669 A | 5/1999 | Horita | |
| 5,984,510 A | 11/1999 | Guruswamy et al. | |
| 5,995,734 A | 11/1999 | Saika | |
| 6,385,565 B1 * | 5/2002 | Anderson et al. | 703/18 |
| 6,532,439 B2 * | 3/2003 | Anderson et al. | 703/14 |
| 6,546,528 B1 * | 4/2003 | Sasaki et al. | 716/5 |
| 6,564,355 B1 * | 5/2003 | Smith et al. | 716/4 |
| 2002/0169590 A1 * | 11/2002 | Smith et al. | 703/18 |

FOREIGN PATENT DOCUMENTS

EP 0 472 317 2/1992

OTHER PUBLICATIONS

Smith, "Decoupling Capacitor Calculations for CMOS Circuits," 1994, IEEE, pp. 101–105.

(List continued on next page.)

*Primary Examiner*—Vuthe Siek
*Assistant Examiner*—Binh Tat
(74) *Attorney, Agent, or Firm*—Meyertons Hood Kivlin Kowert & Goetzel, P.C.; B. Noël Kivlin

(57) ABSTRACT

A methodology for determining the placement of decoupling capacitors in a power distribution system and system therefor is disclosed. In one embodiment, a method for determining the placement of decoupling capacitors in a power distribution system includes determining target impedance, creating a power distribution system model, performing an LC (inductive-capacitive) resonance analysis, and performing a cavity resonance analysis. During the performance of the LC resonance analysis, capacitors may be selected in order to suppress impedance peaks resulting from LC resonances. Following the LC resonance analysis, the method may place the capacitors in the power distribution system at evenly spaced intervals. During the performance of the cavity resonance analysis, the capacitors may be repositioned in the power distribution system so as to suppress cavity resonances.

60 Claims, 13 Drawing Sheets

OTHER PUBLICATIONS

Lee et al., "Modeling and Analysis of Multichip Module Power Supply Planes," IEEE Transactions on Components, Packaging, and Manufacturing Technology—Part B., vol. 18, No. 4, Nov. 1995, pp. 628–639.

Smith, "Packaging and Power Distribution Design Considerations for a Sun Microsystems, Desktop Workstation," 1997 IEEE, pp. 19–22.

O'Sullivan et al., "Developing a Decoupling Methodology for Spice for Multilayer Printed Circuit Boards," presented Aug. 1998.

Chen et al., "Optimum Placement of Decoupling Capacitors on Packages and Printed Circuit Boards Under the Guidance of Electromagnetic Field Simulation," 1996 Electronic Components and Technology Conference, May 1996, pp. 756–760.

Ingels et al., "Design Strategies and Decoupling Techniques for Reducing the Effects of Electrical Interference in Mixed–Mode IC's," IEEE Journal of Solid–State Circuits, vol. 32, No. 7, Jul. 1997, pp. 1136–1141.

Chen et al., "On–chip decoupling capacitor optimization for high–performance VLSI design," 1995 International Symposium on VLSI Technology, Systems, and Applications, May 1995, pp. 99–103.

Chou; "Effects of On–Package Decoupling Capacitors on the Simultaneous Switching Noise".

Hough et al; "New Approaches for the On–Chip Power Switching Noise Reduction"; Custom Integrated Ckts—1995 Conf.; pp. 133–136; May 1995.

Costa et al; "Investigation of EMI on Multilayer Printed Circuit Boards: Delta/I–noise and Power Supply Coupling"; 1996 Symp. Elect. Compatibility; pp. 436–441; Aug. 1996.

Wang et al; "Simultaneous Switching Noise Projection for High–Performance SOI Chip Design"; SOI Conf.; pp. 112–113; Sep. 1996.

Yuan; "Signal Integrity Analysis of Simultaneous Switching Noise and Decoupling Capacitors in Digital Packages and PCB Systems"; Elect. Performance of Elect. Pack.; pp. 132–134; Oct. 1996.

Fang et al; "Reduction of Power and Ground Noise Coupling in Mixed Signal Modules"; Elect. Performance of Elect. Pack.; pp. 90–92; Oct. 1996.

Goetz; "Time and Frequency Domain Analysis of Integral Decoupling Capacitors"; Comp., Pack., & Manuf. Tech.; pp. 518–522; Aug. 1996.

Choi et al; "A Simultaneous Switching Noise Analysis of a High Speed Memory Module Including the Test Environments and System Level Models"; Elect. Performance of Elect. Pack.; pp. 109–112; Oct. 1997.

Yuan; "Analysis of Power/Ground Noises and Decoupling Capacitors in Printed Circuit Board Systems"; Int. Symp. Elect. Compat.; pp. 425–430; Aug. 1997.

Takken et al.; "Integral Decoupling Capacitance Reduces Multichip Module Ground Bounce"; MCMC–93; pp. 79–84; Mar. 1993.

Herrell et al; "EMI and Power Delivery Design in PC Systems"; Elect. Performance of Elect. Pack.; pp. 23–26, Oct. 1997.

Lee et al; "A Comparison of Power Supply Planes in Thick and Thin Film MCMs"; Elect. Performance of Elect. Pack.; pp. 3–6; Nov. 1994.

Chandra et al; "Modeling and Analysis of Computer Power Systems"; Power Elect. Specialists Conf.; pp. 144–151; Jun. 1989.

Michelet; "A Multi–Simulator Environment for Power Supply Simulation"; APEC '91; pp. 278–284; Mar. 1991.

Xu et al; "Equivalent Circuit Models of Switches for Spice Simulation"; Elect. Lett.; pp. 437–438; Mar. 1988.

Buttner; "Setting Up a Retrieval System for Design Reuse—Experiences and Acceptance"; EURO–DAC '95; pp. 575–578; Sep. 1995.

Low et al; "A Low Cost MCM Design Topology—The Interconnected Mesh Power System (IMPS)"; MCMC–95; pp. 200–205; Feb. 1995.

Yook et al; "Application of System–Level EM Modeling to High–Speed Digital IC Packages and PCBs", IEEE Trans. Microwave Theory and Tech.; pp. 1847–1856; Oct. 1997.

Van den Berghe et al; "Power Plane Resonances as a Source of Delta_I Noise and the Influence of Decoupling Capacitors"; IEEE 1997 Int. Symp. Elect. Compat.; pp. 145–148; Aug. 1997.

Spice User's Guide—pp. 1–132; 1993.

Benini et al; "Distributed EDA Tool Integration: the PPP Paradigm"; ICCD '96; pp. 448–453; Oct. 1996.

Hubing et al; "Power Bus Decoupling on Multilayer Printed Circuit Board"; IEEE Trans. Elect. Compat.; pp. 155–166; May 1995.

Becker et al; "Power Distribution Modeling of High Performance First Level Computer Packages"; Elect. Performance of Elect. Pack; pp. 202–205; Oct. 1993.

Raghuram et al; Implementation of Pole–Zero Analysis in Spice Based on the MD Method; Ckts and Systems; pp. 380–383; May 1991.

Matsui et al; "Spice Based Analysis of Radiation from PCBs and Related Structures"; IEEE 19970Int. Symp. Elect. Compat.; pp. 320–325; Aug. 1997.

Divekar et al; "Automatic Generation of Spice Macromodels from N–port Parameters"; Ckts & Sys.; pp. 670–673; Aug. 1994.

Raghuram et al; "Inductance Computation of Multiple Arbitrarily Shaped Planes"; Elect. Performance of Elect. Pack; pp. 215–218; Nov. 1994.

Raghurum et al; "Efficient Computation of Ground Plane Inductances and Currents"; Elect. Performance of Elect. Pack.; pp. 131–134; Oct. 1993.

Divekar et al; "Analog Macromodeling and Simulation of Integral Decoupling Capacitors in Single and Multichip Module Electronics Packaging", Elect. Components & Tech. Conf.; pp. 945–948; May 1994.

Wu et al; "Modeling and Simulation of Integral Decoupling Capacitors in Single and Multichip Module Electronics Packaging"; Elect. Components & Tech. Conf.; pp. 945–948; May 1994.

* cited by examiner

METHODOLOGY FOR DETERMINING THE PLACEMENT OF DECOUPLING CAPACITORS IN A POWER DISTRIBUTION SYSTEM

BACKGROUND OF THE INVENTION

1. Field of the Invention

This invention relates to electronic circuits, and more particularly, the design of power distribution systems.

2. Description of the Related Art

As computer system technology advances, there is a continuous demand for systems that demand higher power at a relatively low voltage. Designing power distribution systems that can deliver a large amount of current at low voltages is a significant challenge. Tight voltage tolerances (e.g. ±5%) are often times required to ensure the proper performance of silicon chips within a computer system. The lower operating voltages may result in much lower target impedance requirements. At the same time, the clock frequencies at which microprocessors and other types of silicon chips operate are continually increasing, thereby resulting in a much wider frequency range for which target impedance requirements must be met.

Power distributions systems typically include at least one pair of planar conductors (e.g. a power plane and a ground plane), separated by a dielectric layer. A plurality of capacitors may be electrically connected in a parallel configuration between the planar conductors in order to provide a low impedance path for power distribution. Many power distribution systems employ a plurality of ceramic capacitors mounted upon a printed circuit board (PCB). Such capacitors may be chosen based on their ability to meet target impedance requirements for a given frequency. Capacitors having different electrical characteristics may be chosen to meet the target impedance requirements over a wide frequency range.

Electrical characteristics of capacitors which must be considered when designing power distribution systems include capacitance, equivalent series resistance (ESR) and equivalent series inductance (ESL). These characteristics have a significant effect on the electrical response of a given capacitor over a frequency range. At lower frequencies, the impedance provided by a capacitor is dominated by its capacitance. Since capacitors include conductive elements, such as conductive plates and mounting pads or pins, there is an inductance (ESL) associated with them. This inductance dominates the impedance profile of a capacitor at higher frequencies. The point at which the inductive and capacitive reactances cancel each other out is known as the resonant frequency, and the impedance provided by the capacitor at this frequency (which is purely resistive) is known as the ESR.

FIG. 1 illustrates the frequency response for a typical capacitor. At lower frequencies, the impedance decreases with frequency at a rate of approximated −20 dB/decade. At these frequencies, the impedance provided by the capacitor is dominated by capacitance, and may be calculated by the formula $$Z = \frac{1}{j\omega C},$$

where Z is the impedance, C is the capacitance, and $\omega$ is the angular frequency. As frequency increases, the capacitor will eventually achieve a state of resonance, as the capacitive reactance will be offset by the inductive reactance. This resonant frequency, sometimes referred to as the series resonant frequency, may be calculated by the formula $$F = \frac{1}{2\pi\sqrt{LC}},$$

where F is the resonant frequency, L is the equivalent series inductance, and C is the capacitance. The impedance provided by a capacitor at its resonant frequency is the capacitor's ESR. At frequencies above the resonant frequency, the impedance provided by a capacitor may be dominated by its ESL. The impedance of the capacitor for frequencies greater than the resonant frequency may be calculated by the formula $$Z = j\omega L,$$

where Z is the impedance, L is the ESL, and $\omega$ is the angular frequency. In designing power distribution systems, a plurality of capacitors having different impedance profiles may be combined in order to achieve a target impedance over a wide frequency range.

Designing power distribution systems and determining the necessary decoupling capacitors may include a significant amount of modeling and simulation. The power distribution system, as well as the various circuitry to which power is to be provided, may be modeled and simulated so as to predict the performance of the power distribution system under various operating conditions.

Performance prediction using modeling and simulation may include determining the effects of certain resonances that may affect power distribution system operation. These resonances may be associated with the parallel plate geometry of the power planes, and may have significant effect on the performance of the power distribution system if not accounted for during the design phase. In particular, there are two types of resonances that typically must be addressed in order to design a power distribution system that is effectively decoupled over a wide frequency bandwidth. One of these types of resonances is known as LC (inductive-capacitive) resonance. LC resonance may result from the inter-plane capacitance (i.e. the capacitance existing between the power and ground planes, including any capacitors electrically coupled between these planes) resonating with the inductance of the mounted decoupling capacitors. LC resonance may result in one or more impedance peaks at frequencies about the series resonant frequency.

The other type of resonance that must be managed is known as cavity resonance. Cavity resonances may be a function of the dimensions (x-y) and geometry of the circuit board or carrier of the power distribution system and the various frequencies of the system (i.e. clock frequencies and associated harmonics). In particular, the relationship between the dimensions of the circuit board and the wavelengths of the various frequencies present may cause impedance peaks and valleys to occur at various physical positions on the board itself. These positions may be located at distances that are multiples of ¼ wavelength, ½ wavelength, ³⁄₂ wavelengths, and so on, from the edge of the circuit board. Standing waves at these positions may result in either impedance peaks or impedance valleys. The high impedance peaks, if left unchecked, may result in excess noise in the power distribution system, and may also be problem frequencies for electromagnetic interference (EMI).

Managing both the LC and cavity resonances may be affected by the manner in which the power distribution system and its various components are modeled, as well as the order in which the resonances are dealt with during the design phase. However, it is important that impedance peaks resulting from both of these types of resonance be damped in order to meet target impedance requirements across a wide range of frequencies.

FIGS. 2 and 3 may illustrate the effects of one method of modeling capacitors. FIG. 2 is a schematic of one embodiment of a traditional electrical model for a capacitor. The embodiment shown is a model of a capacitor based on a series RLC circuit. The model includes a resistor representing the capacitor's ESR value, a capacitor representing its capacitance value, and an inductor representing its ESL value. The model may be implemented as a SPICE model or other type of mathematical for simulation on a computer system.

The capacitor model of FIG. 2 may be useful for simulation at lower frequencies, but may be inadequate for higher frequencies. As previously stated, power distribution systems typically include a pair of planar conductors separated by a dielectric, which may act as a capacitor at lower frequencies. At higher frequencies, a pair of planar conductors may develop the impedance resonances discussed above. Impedance peaks resulting from these resonances are sometimes referred to as anti-resonances, or parallel resonances. The traditional series RLC circuit model of a capacitor may be unable to correctly predict the frequency or frequencies at which anti-resonances occur.

FIG. 3 is a graph illustrating the simulated and measured performance of a capacitor mounted between two power planes over a range of frequencies, wherein the simulation is based on the traditional model of FIG. 2. Both the simulated and measured results were for a pair of conductive planes (i.e. a power plane and ground plane) having a single capacitor mounted and electrically connected between the planes. The capacitor model used for the simulated results was the traditional RLC series circuit model. As can be seen from examining the graph, model-to-hardware correlation is good for the lower frequencies. However, the simulated results differ from the measured results significantly with respect to both the frequency and magnitude of the first anti-resonant peak. In this particular example, the simulated results predict an anti-resonant peak at a lower frequency and of significantly higher magnitude than that obtained by the measured results. Second and third anti-resonant peaks also differ between simulated and measured results. The second anti-resonant peak from the measured results occurs at a frequency close to that which is predicted by the simulated results. The third anti-resonant peak for the measured results occurs at a higher frequency and lower magnitude than predicted by the simulated results.

In addition to the problems inherent in the modeling as discussed above, the order in which the various resonances are dealt with may also complicate the design problem. Attempts to suppress impedance peaks induced by LC resonance may result in the changing of behavior of the cavity resonances. In particular, the peaks associated with cavity resonances may change frequency as the result of the suppression of impedance peaks resulting from LC resonances. The shifting frequency of the cavity resonance peaks may in turn lead to changing locations of the poles and zeros of the system when analysis is performed in the frequency domain. Thus, the problems of predicting the amplitude and frequency of anti-resonant peaks resulting from the modeling may be further aggravated by the shifting of anti-resonant peaks resulting from one type of resonance when attempting to manage another type of resonance.

SUMMARY OF THE INVENTION

A methodology for determining the placement of decoupling capacitors in a power distribution system and system therefor is disclosed. In one embodiment, a method for determining the placement of decoupling capacitors in a power distribution system includes determining a target impedance, creating a power distribution system model, performing an LC (inductive-capacitive) resonance analysis, and performing a cavity resonance analysis. During the performance of the LC resonance analysis, capacitors may be selected in order to suppress impedance peaks resulting from LC resonances. Following the LC resonance analysis, the method may place the capacitors in the power distribution system at evenly spaced intervals. During the performance of the cavity resonance analysis, the capacitors may be repositioned in the power distribution system so as to suppress cavity resonances.

In one embodiment, performing the LC resonance analysis may include a single node analysis of the capacitors selected for the power distribution system. Following an initial selection of decoupling capacitors, a system for performing the method may simulate the capacitors as being connected in parallel. The simulation may further include injecting a signal at a node where the capacitors are electrically coupled and sweeping the signal across a frequency range of interest. Following the sweeping of the signal, a comparison of the measured impedance at one or more frequencies with the target impedance may be performed, with special attention paid to any anti-resonant impedance peaks that may be present. The methodology may then repeat the selecting of capacitors, which may include adding capacitors to the system and/or selecting capacitors having different electrical characteristics. Following the repeating of the capacitor selection, the methodology may again simulate the injection of a signal and the sweeping across a frequency range. This iterative process may continue until the impedance peaks are all suppressed to a level at or below the target impedance. When the measured impedance (sometimes referred to as the transfer impedance) is below the target impedance for all required frequencies, the method may place the capacitors in the power distribution system at evenly spaced intervals.

Performing the cavity resonance analysis may include simulating the injection of a signal at a predetermined node in the power distribution system, sweeping the signal across a frequency range, and analyzing the results at a plurality of nodes. In one embodiment, the power distribution system may be modeled by an M×N grid having a plurality of cells connected at predetermined nodes. The signal may be injected at any of these nodes, while the analysis may be performed at any or all of the predetermined nodes. The analysis may include comparing the transfer impedance measured at each of the predetermined nodes to the target impedance for one or more frequencies. The analysis may further include determining the frequency and physical location within the power distribution system where impedance peaks may occur. In response to determining the frequency and physical location of an impedance peak, a nearby capacitor having a series resonant frequency that is approximately the same as the frequency of the impedance peak may be moved to or near that physical location in order to suppress the peak. This may be followed by repeating the injection of the signal and sweeping it across the frequency range. The method of cavity resonance analysis may undergo a number of iterations, repositioning capacitors until all impedance peaks resulting from cavity resonances are suppressed to a level at or below the target impedance. In one embodiment, the iterative process may begin by addressing the impedance peaks occurring at the lowest frequencies first and then progressively addressing the peaks at higher frequencies. This iterative process may continue until all of the peaks are sufficiently suppressed and that the transfer impedances is at or below the target impedance for all measured frequencies.

In one embodiment, a computer system may be configured to perform the method responsive to executing instructions stored on a carrier medium. The computer system may include one or more output devices for displaying the results of the methodology to a user. The user may also be able to view intermediate results through one of the output devices. Results obtained from performing the method may be presented by any suitable method of presentation, including the presentation of graphical results or tabulated results.

BRIEF DESCRIPTION OF THE DRAWINGS

Other aspects of the invention will become apparent upon reading the following detailed description and upon reference to the accompanying drawings in which.

Figure 1:
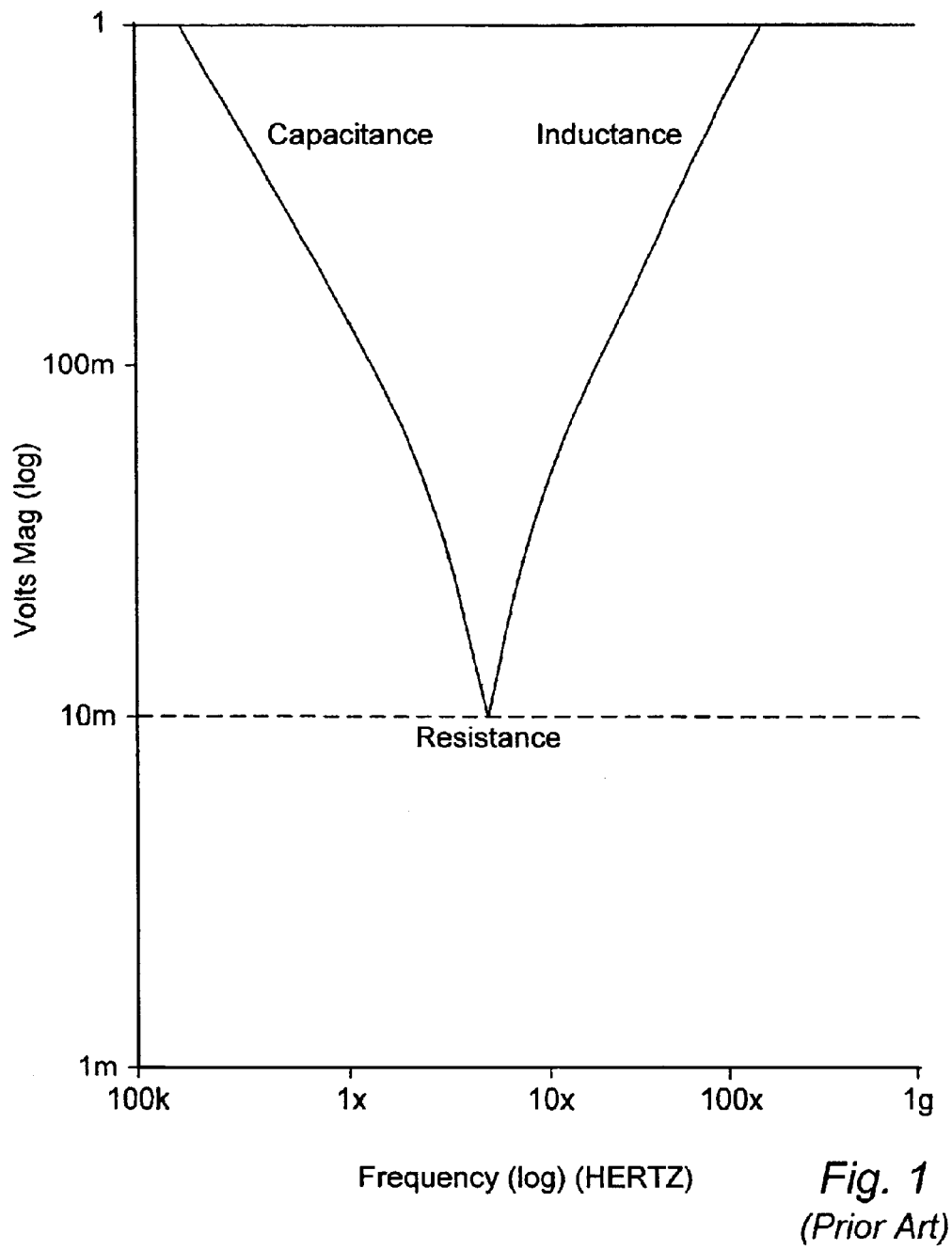
FIG. 1 (prior art) is a graph illustrating the frequency response of a single capacitor over a range of frequencies.
Figure 2:
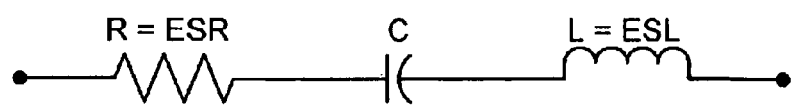
FIG. 2 (prior art) is a schematic of one embodiment of a traditional electrical model for a capacitor.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined by the appended claims.

DETAILED DESCRIPTION OF THE INVENTION

FIG. 4—Power Distribution System Model

Figure 4A:
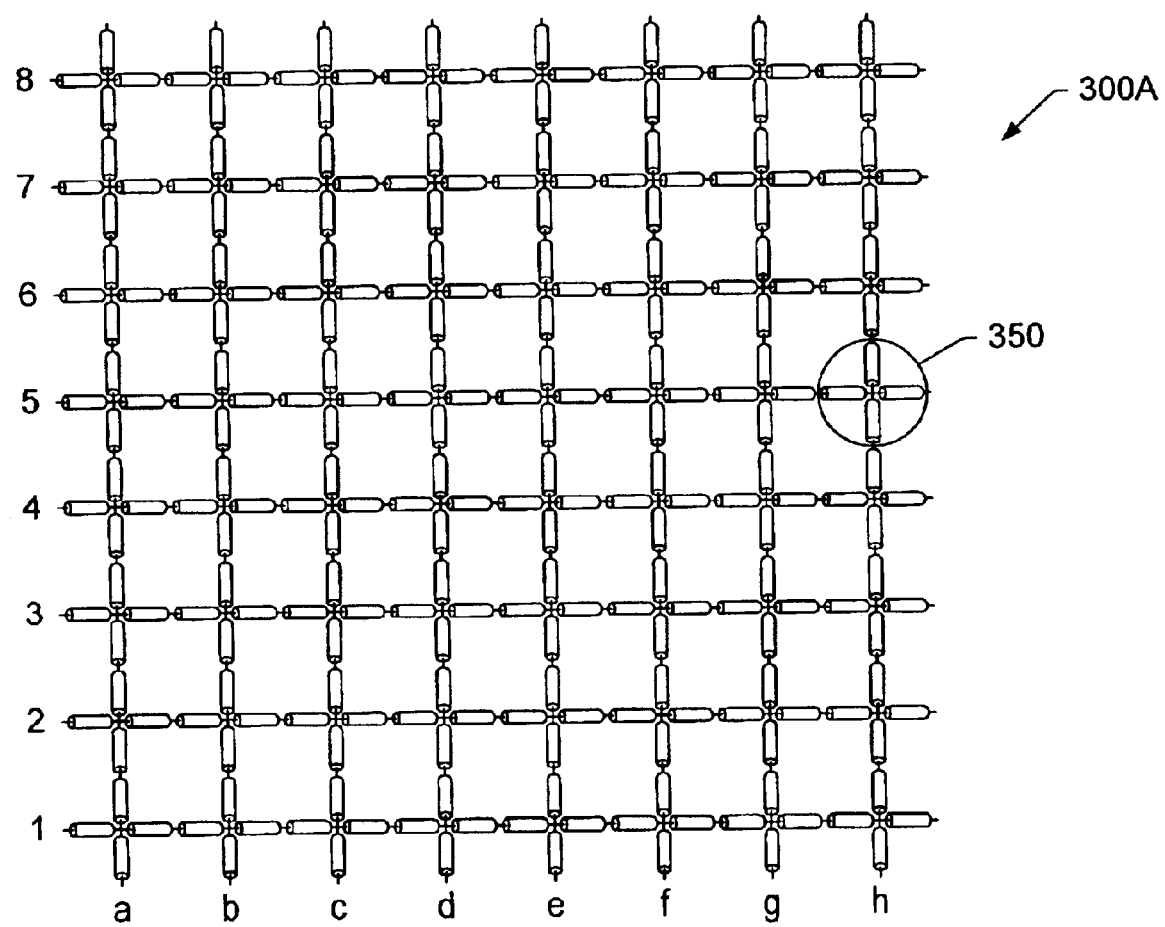
FIG. 4A is a top view of one embodiment of a model of a power distribution system.

FIG. 4A is a top view of a simplified schematic of one embodiment of a model of a power distribution system for an electronic circuit. As shown, the model comprises a grid 300A of transmission line segments. The segments are grouped into unit cells 350. As shown, there are eight columns labeled "a" through "h", as well as eight rows labeled, from the bottom to the top, "1" through "8", The model preferably comprises a SPICE array of transmission lines in a fixed topology (i.e. in an 8×8 grid). The transmission lines may be of variable lengths such that the fixed topology may be used on electrical connecting device of any physical dimensions. It is noted that other embodiments of the power distribution system are contemplated, such as an elliptical model based on a "wheel and spoke" geometry. The model may be implemented using circuit simulation software on a computer system. In one embodiment, the model may be a SPICE model, although models using other types of circuit simulation software are possible and contemplated. It is further noted that the grid, which is an 8×8 grid in this embodiment, may be of any size and shape (e.g. a 16×10 grid).

Figure 4B:
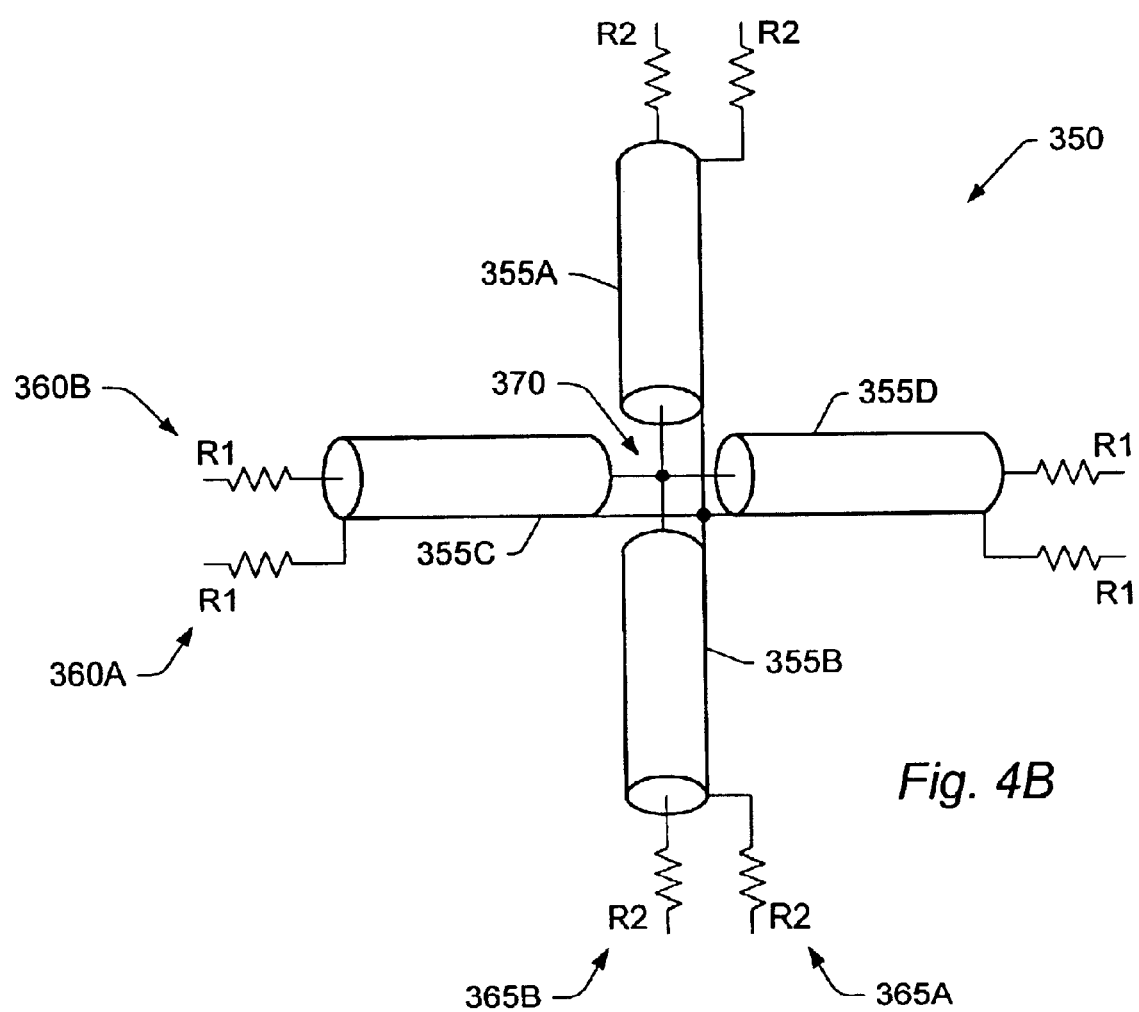
FIG. 4B is an embodiment of a unit cell of the power distribution system model shown in FIG. 4A.

FIG. 4B illustrates a close up view of the unit cell 350 from FIG. 4A. As shown, the unit cell 350 may be comprised of four transmission lines 355–355D. The four transmission lines 355 connect together at nodal point pair 370, also referred to as node 370. As shown, connections to the center conductors represent plane 1, while connections to shield are plane 2. Note that the model is balanced, therefore either plane 1 or plane 2 may be power or ground, as desired. Transmission lines 355A and 355B are preferably described with a width impedance "$Z_W$" and a width time delay "$t_{DW}$", Transmission lines 355C and 355D are preferably described with a length impedance "$Z_L$" and a length time delay "$t_{DL}$". $R_1$ and $R_2$ are resistances. The constants, parameters and variables of interest, as well as the equations that define and relate these quantities, along with the preferred units are given below:

"L" is the length of the plane (inches)
"W" is the width of the plane (inches)
"thk" is the thickness of the dielectric (mils)
"cu" is the metalization thickness (mils)
"velc" is the speed of light in a vacuum (inches/sec)

"hertz" is the frequency variable

"$\epsilon_0$" is the vacuum dielectric constant (permittivity) (picofarads/inch)

"$\epsilon_r$" is the dielectric constant

"$\sigma$" is the copper conductivity (per ohm/mils)

"$\mu_0$" is the permeability of a vacuum (henries/mil)

"vel" is the velocity of a signal on the electrical interconnecting apparatus $$vel = velc/\sqrt{\sqrt{\epsilon_r}}$$

"n" is the size of the grid, i.e. 8 as shown

"asp" is the aspect ratio of the grid, asp=L/W

"factor" is a calibration factor to compensate for capacitive loading $$factor = 1/\sqrt{\sqrt{2}}$$

"$t_{FL}$" is the time of flight for the length dimension, $t_{FL} = L/vel$

"$t_{FW}$" is the time of flight for the width dimension, $t_{FW} = W/vel$

"$t_{DL}$" is the transmission line delay time for the length dimension $$t_{DL} = t_{FL}/(2n) \text{factor}$$

"$t_{DW}$" is the transmission line delay time for the width dimension $$t_{DW} = t_{FW}/(2n) \text{factor}$$

"cap" is the parallel plate capacitance of the plane $$cap = (\epsilon_0 \epsilon_r LW)/(10^{-9} thk)$$

"$Z_L$" is the impedance in the length direction $$Z_L = (n/cap)(t_{FL} + asp \cdot t_{FW}) \text{factor}$$

"$Z_W$" is the impedance in the width direction, $Z_W = Z_L/asp$

"$R_1$" is the smaller of:

$$R_{1A} = ((L/W)/2) \cdot (1/(\sigma \cdot (1/\sqrt{hertz \cdot \pi \mu_0 \sigma})))$$

$$R_{1B} = ((L/W)/2) \cdot (1/(\sigma \cdot cu))$$

"$R_2$" is the smaller of:

$$R_{2A} = ((W/L)/2) \cdot (1/(\sigma \cdot (1/\sqrt{hertz \cdot \pi \mu_0 \sigma})))$$

$$R_{2B} = ((W/L)/2) \cdot (1/(\sigma \cdot cu))$$

The model represents an electrical interconnecting apparatus, which may be, for example, a printed circuit board (PCB), a semiconductor device package substrate, or an integrated circuit substrate. The method may include creating a model of the power distribution system based upon an M×N grid for both the power plane and the ground plane. The model may be based upon a fixed grid that adapts automatically to the actual physical dimensions of the electrical interconnecting apparatus. The model may also calculate the system response to chosen decoupling capacitors in both single node and M×N node versions.

The model may receive input from a user and/or from a database of various physical and/or electrical characteristics for a plurality of decoupling capacitors. Various characteristics of interest include physical dimensions, type and thickness of dielectric, method and materials of manufacture, capacitance, mounted inductance, and equivalent series resistance (ESR). The desired characteristics are may be saved in a database for corrections, additions, deletions, and updates. The model of the power distribution system may be updated based on the selection of decoupling capacitors. The capacitors themselves may be modeled as "ladder" circuit, which will be explained in further detail below.

In one embodiment, the model of the power distribution system may be in a form representing a plane having two dimensional distributed transmission lines. The model of the power distribution system may comprise a plurality of the following: one or more physical dimensions of the power plane, one or more physical dimensions of the ground plane, physical separation distance of the power plane and the ground plane, composition of a dielectric separating the power plane and the ground plane, one or more active device characteristics, one or more power supply characteristics, and one or more of the decoupling capacitors. In a one embodiment, M and N have an equal value, 8 as shown in this particular example. However, other embodiments are possible and contemplated wherein M and N have greater or lesser values, and are not necessarily of equal value. In general, the values M and N can be adjusted to in order to ensure the accuracy of simulations based on the power distribution system model.

In various embodiments, the active components may act as current sources and/or sinks, and may include processors, memories, application specific integrated circuits (ASICs), or logic ICs. In one embodiment, a total sum of all values of the current sources in the model may be scaled to equal one ampere.

The power distribution system may include a power supply, and thus the power distribution system model may include attributes of the power supply. The power supply attributes may include a voltage, voltage ripple, and maximum current. Further attributes of the power supply which may be included in the model may be one or more pole frequencies, one or more zero frequencies, and one or more resistances, such as output resistances of the power supply.

In one embodiment, the method for determining the required decoupling capacitors of the power distribution system may comprise determining the decoupling capacitors for a frequency range of interest. The frequency range of interest may be determined based on various factors, such as frequency of operation of various IC's which receive power from the power distribution system, clock frequencies and associated frequency content of the clock edge rates, harmonic frequencies and so on. In one embodiment, the target impedance may be constant over the frequency range of interest, while in another embodiment, the target impedance may be a continuous function of frequency, and thus may vary over the frequency range of interest.

In various embodiments, the method may use a weighting factor in determining a quantity of a particular decoupling capacitor to include in the model. The weighting factor is a dimensionless non-zero positive number. In the frequency range where EMI is most important, the preferred weighting factor is 0.2. The EMI frequency range is preferably above approximately 200 MHz. Preferably, the weighting factor is 1.0 in a frequency range where signal integrity is most important. The frequency range where signal integrity is important may be approximately 10 MHz up to approximately 200–300 MHz. The weighting factor is preferably 2.0 at all active device operating frequencies and harmonics of the active device operating frequencies. In one embodiment, the model may account for the affects of frequency dependent skin effect loss.

FIG. 5—Grid

Figure 5:
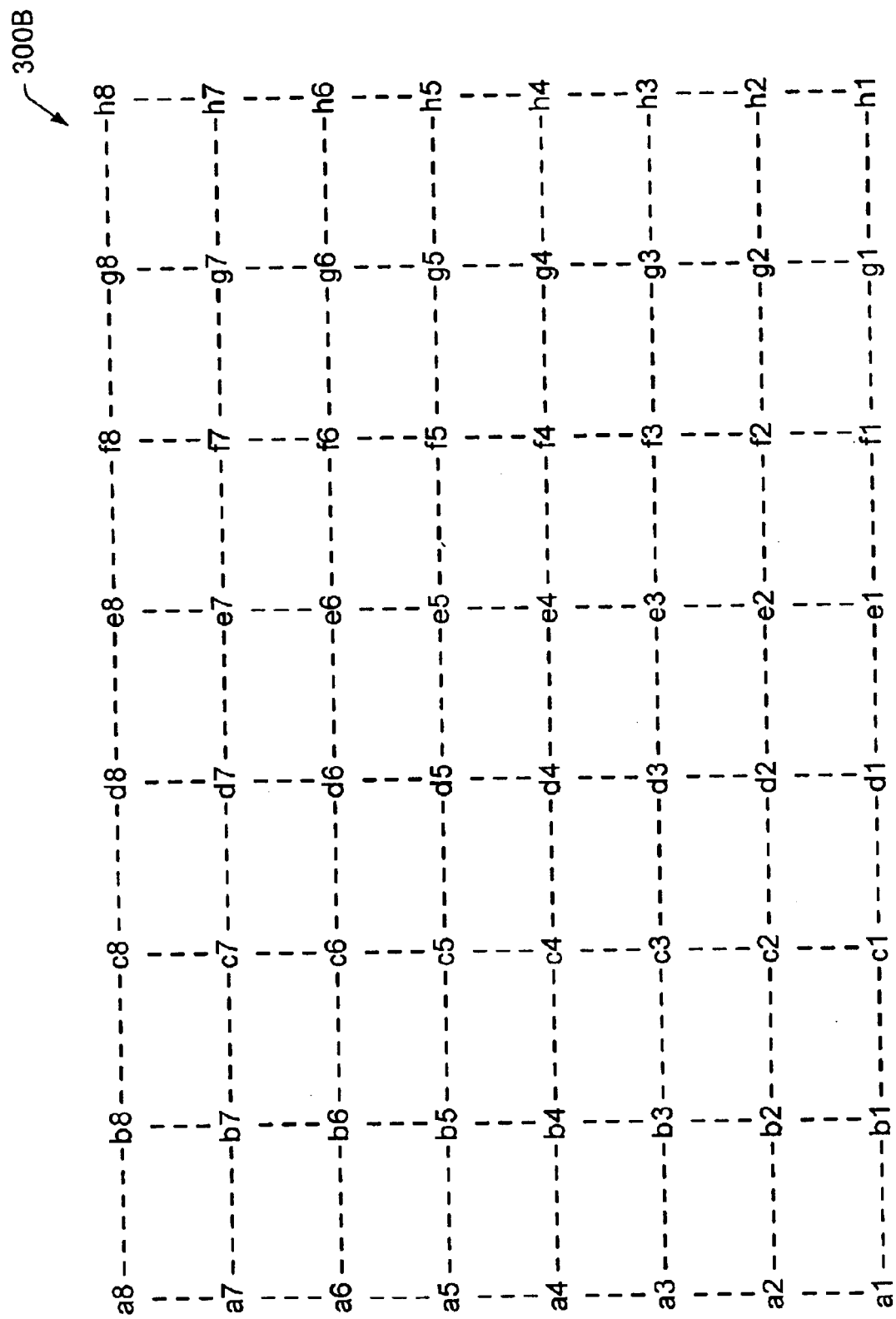
FIG. 5 is a representative grid of the nodal interconnections of the model of the power distribution system shown in FIG. 4A

FIG. 5 illustrates the 8×8 grid 300B of nodes 370 that are used to model the power and ground planes with the respective designations of a1 through h8, in one embodiment. This grid 300B may be used to determine the locations of the decoupling capacitors for the power distribution system.

Figure 6:
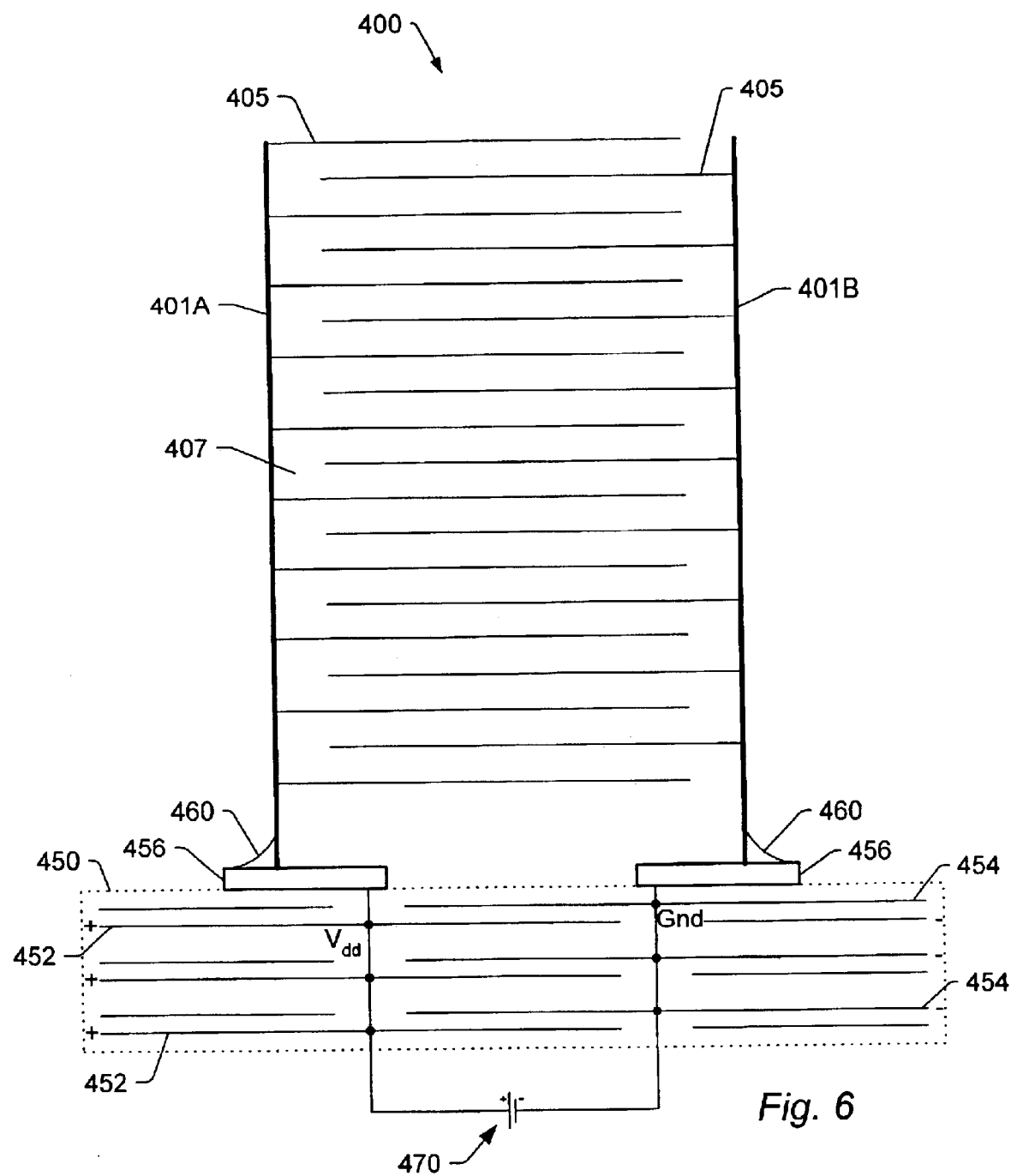
FIG. 6 is a cross section of one embodiment of a discrete capacitor mounted on a PCB having a plurality of power plane pairs.

FIG. 6—Cross Section of a Discrete Capacitor

FIG. 6 is a cross section of one embodiment of a discrete capacitor mounted on a PCB having a plurality of power plane pairs. Capacitor 400 includes a first post 401A and a second post 401B, each made of a conductive material. Solder fillets 460 are used to physically and electrically couple capacitor 400 to mounting pads 456 of printed circuit board (PCB) 450. PCB 450 includes a plurality of power planes 452 and ground planes 454. First post 401A of capacitor 400 is electrically coupled to power planes 452 while second post 401B of is electrically coupled to ground planes 454. Power planes 452 and ground planes 454 of PCB 450 may be coupled to a power supply 470. In some embodiments, power supply 470 may be part of a printed circuit assembly of which PCB 450 is a part. In other embodiments, power supply 470 may be an external power supply that is connected to power plane 452 and ground plane 454 by a connecting means such as a cable and/or connector. Power supply 470 may also be a voltage regulator which is configured to receive a first voltage at a first current and output a second voltage at a second current. The first voltage may be received from a source on PCB 450, or from an external source.

Other embodiments of capacitor 400 are possible and contemplated. Such embodiments may include a different geometry, a greater or lesser number of capacitor plates, and a different means for physically and/or electrically coupling the capacitor to a carrier (e.g. a printed circuit board).

Capacitor 400 includes a plurality of conductive plates 405. Approximately half of the conductive plates 405 may be electrically connected to first post 401A, with the remaining conductive plates 405 electrically connected to second post 401B. Dielectric material 407 may be arranged between conductive plates 405 and interspersed throughout capacitor 400. Conductive plates 405 may provide a majority of the ESR of capacitor 400, although posts 401A and 401B may make contributions to the ESR as well. Dielectric 407 contributes little, if any, to the ESR of capacitor 400 at frequencies below 1 GHz.

Current may travel around a loop and through capacitor 400. The current path around the loop may start on the power plane 452, through mounting pad 456 and solder fillet 460 and into first post 401A. After current enters first post 401A, it may continue up through the post or may distribute itself laterally into one of plates 405. Since electrical current follows the path of least resistance, the current will distribute itself accordingly. Eventually, all current paths will lead into the capacitor plates 405 which are connected to first post 401A, where the conduction current will become a displacement current as it travels through dielectric 407. The displacement current may then revert back to a conduction current as it distributes itself onto the capacitor plates 405 that are connected to second post 401B. The current may then travel through second post 401B, solder fillet 460 and mounting pad 456, and into ground plane 454.

All conductive materials include a certain amount of inductance. Recall that the impedance of an inductor (or any conductor having inductance) may be defined by the formula $Z=j\omega L$. From the formula it can be seen that the impedance of an inductor increases proportionally as frequency increases. Thus, as frequency increases, the current entering first post 401A may encounter greater impedance as it travels higher into the post. Since current takes the path of least resistance (or impedance), current at higher frequencies will tend to distribute itself onto the lower conductive plates 405 rather than traveling through the length of first post 401A before distributing itself onto a conductive plate 405. Thus, at high frequencies, the current traveling though capacitor 400 may make a smaller loop than at lower frequencies. This phenomenon, combined with the physical construction of the capacitor may be used to form the basis for an improved capacitor model which may be used in the various embodiments of the system and method for determining the decoupling capacitors for a power distribution system.

Figure 7A:
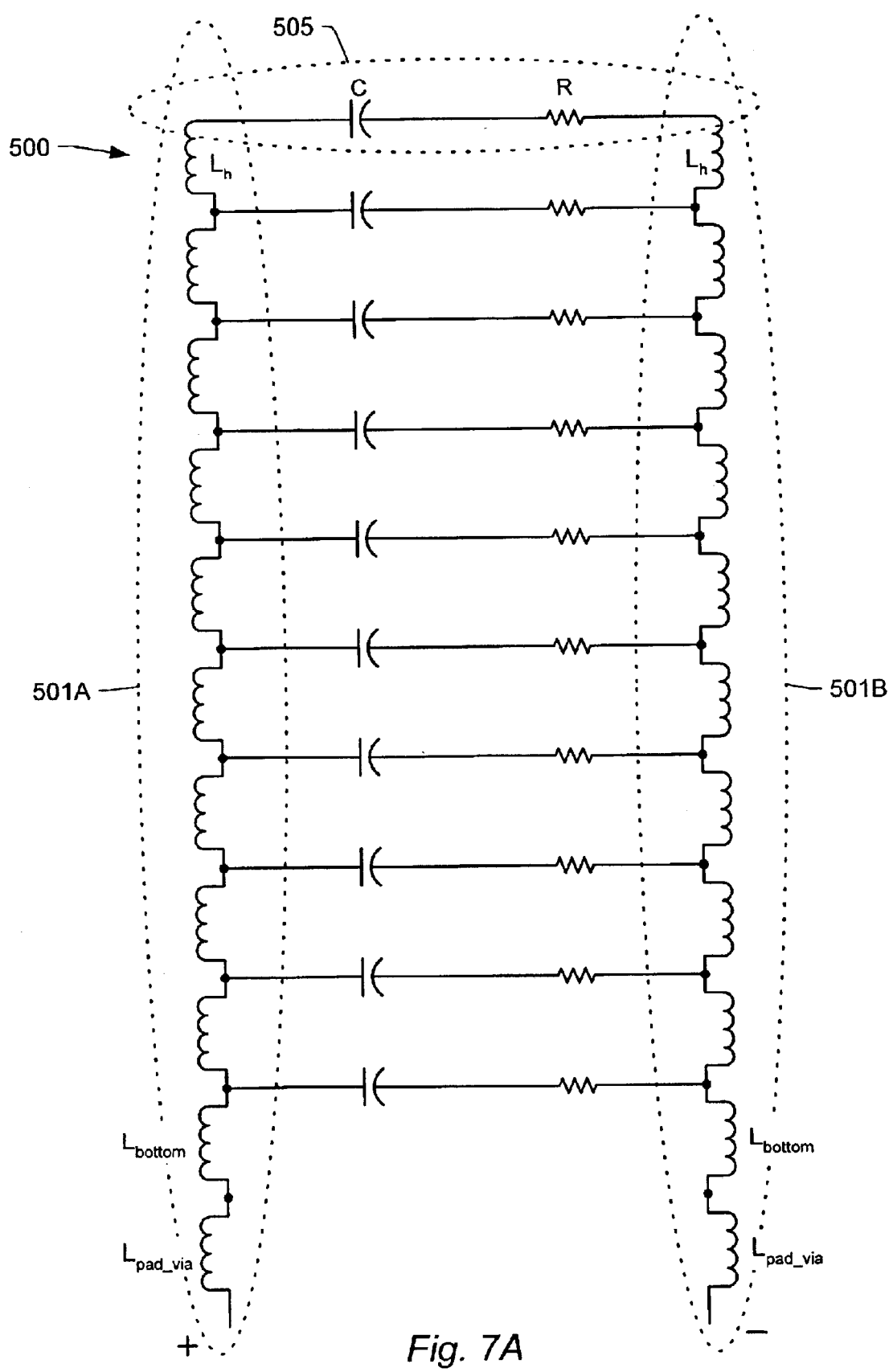
FIG. 7A is a schematic diagram of one embodiment of a distributed model of a discrete capacitor, such as that of FIG. 6.
Figure 7B:
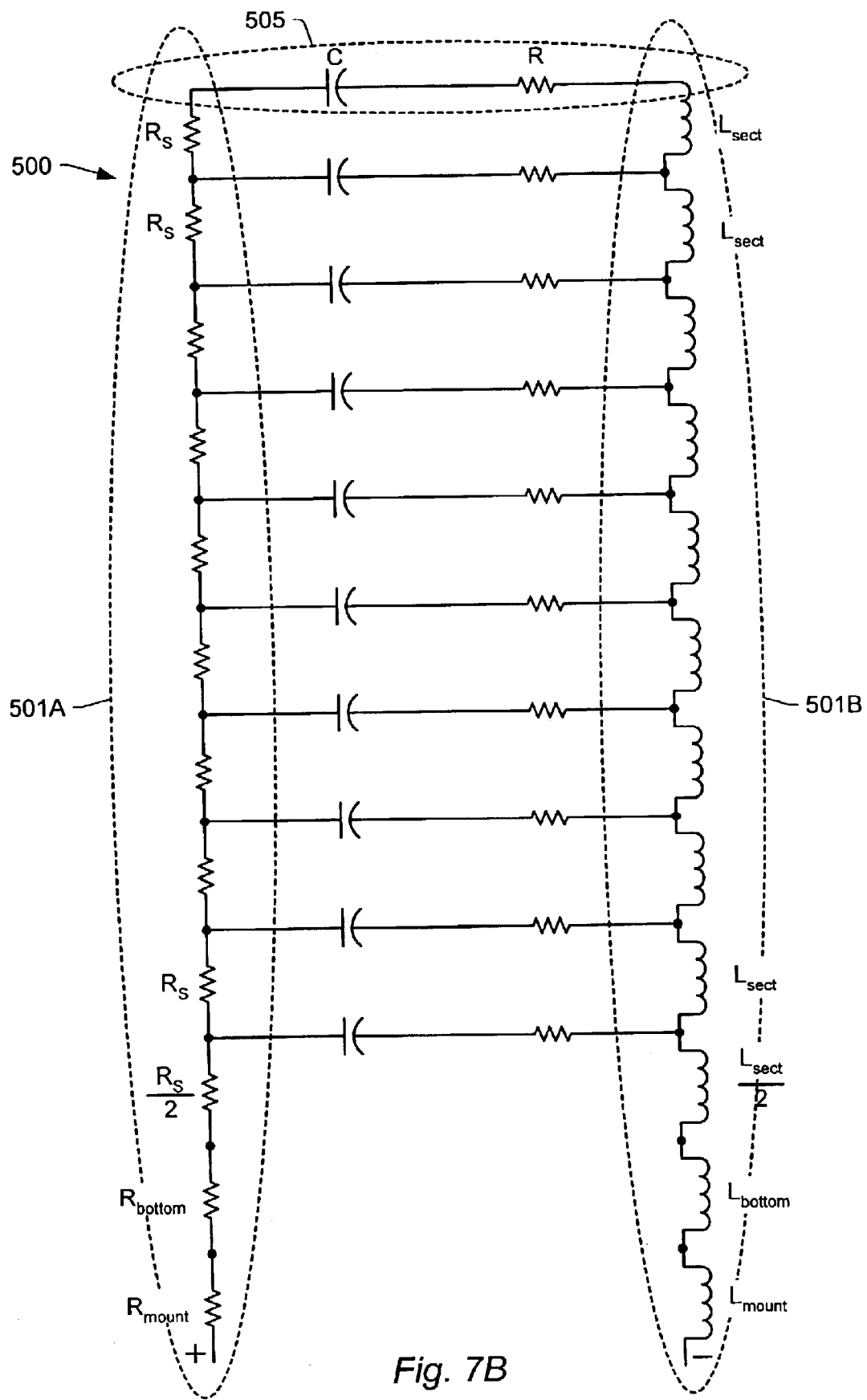
FIG. 7B is a schematic diagram of another embodiment of a distributed model of a discrete capacitor.

FIGS. 7A and 7B—Distributed Models of a Discrete Capacitor

Moving now to FIG. 7A, a schematic diagram of one embodiment of a distributed model of a discrete capacitor is shown. Ladder circuit 500 may be used as a basis of a model for representing a capacitor, such as capacitor 400 of FIG. 6. The traditional series RLC circuit model of a capacitor models the parameters of a given capacitor as lumped parameters. In contrast, ladder circuit 500 uses distributed parameters to model a capacitor. In one embodiment, the model may be implemented in circuit simulation software (e.g. the model may be a SPICE model in one embodiment). In the embodiment shown, ladder circuit 500 includes "rail" circuits 501A and 501B, and a plurality of "rung" circuits 505. The terminology used herein to describe ladder circuit 500 is used in order to simplify the explanation of the arrangement of the various circuit elements present in the circuit model. The schematic of ladder circuit 500 reveals an arrangement of circuit elements resembling a ladder having a pair of rails and a plurality of rungs.

Rail circuits 501A and 501B each comprise a plurality of inductors arranged in a series configuration. Each of the inductors of rail circuits 501A and 501B represent a portion of the total equivalent series inductance (ESL) of the capacitor which is modeled by ladder circuit 500. Rail circuits 501A and 501B are electrically coupled to each other by rung circuits 505, each of which includes a resistor and a capacitor. Each resistor present in ladder circuit 500 represents a portion of the total equivalent series resistance (ESR) of the capacitor modeled by ladder circuit 500. Similarly, each of the capacitors present in ladder circuit 500 represent a portion of the total capacitance provided by the capacitor that is modeled by ladder circuit 500. The actual number of rung circuits 505, as well as the number of inductors in rail circuits 501A and 501B, may be adjusted for various embodiments to correspond with the construction of the capacitor that is to be modeled. In general, the number of rung circuits 505 may be approximately equal to the number of plates in the capacitor that is being modeled. In some embodiments, the number of rung circuits may be exactly equal to the number of plates present in the modeled capacitor. Physical dimensions and the actual number of plates present of the capacitor to be modeled may be important factors to be considered when modeling a particular capacitor.

As previously stated, rail circuits 501A and 501B are electrically connected to each other by a plurality of rung circuits 505. Each rung circuit 505 provides an electrical connection between the rail circuits at distinct nodes as shown in the schematic. At the bottom of rail circuits 501A and 501B are inductors $L_{bottom}$ and $L_{pad\_via}$. The inductors $L_{bottom}$ of each rail simulate the inductance provided by the bottom of the posts (such as posts 401A and 401B of FIG. 6), while the inductors $L_{pad\_via}$ simulate the inductance provides by the mounting pads and solder connections.

During simulation of a capacitor modeled by ladder circuit 500, current will distribute itself according to a path of least impedance. As previously noted, the reactance of an inductor (and thus its impedance) is directly proportional to frequency, while the reactance of a capacitor is inversely proportional to frequency. At lower frequencies, the inductors represent a small reactance, while the capacitors represent a large reactance. Thus, at low frequencies, current traveling into capacitor 400 of FIG. 7 may tend to distribute itself relatively evenly among the conductive plates 405. Similarly, at low frequencies, current in ladder circuit 500 may tend to distribute itself relatively evenly among the rung circuits 505.

As frequency increases, the impedance provided by the inductance present in capacitor 400 increases proportionally. With the larger current loops associated with the higher conductive plates 405, more magnetic flux is stored, and thus a larger inductance (and therefore impedance) is created. Similarly, in ladder circuit 500, at higher frequencies, greater impedances are associated with rung circuits 505 that are higher on the ladder. This is because current traveling through the higher rung circuits 505 encounter more inductors, and therefore more inductive reactance, than those rung circuits closer to the bottom of the ladder. Thus, as frequency increases, the current through ladder circuit 500 tends to distribute itself along the lower rung circuits 505. The tendency of current to stay low in the smaller loops in capacitor 400 (and as simulated using the capacitor model based on ladder circuit 500) may have profound effects on the magnitude and frequency of the parallel anti-resonances produced when the capacitor is mounted upon a PCB. This will be explained in further detail with respect to FIGS. 8A, 8B, and 8C.

FIG. 7B illustrates another embodiment of the distributed capacitor model. In this particular embodiment, rail circuit 501A is made up of a plurality of series-connected resistors, while rail circuit 501B is made up of a plurality of series-connected inductors. During simulation, the capacitor model will behave in a manner similar to the model illustrated in FIG. 7A, although the model of FIG. 7B may be less inductive. This circuit model may be a more accurate representation for some capacitors, including various embodiments of the capacitor illustrated in FIG. 6.

In the embodiment shown, the resistors in rail circuit 501A include a plurality of sectional resistors $R_S$, a half-sectional resistor $R_S/2$, a bottom resistor $R_{bottom}$, and a mount resistor $R_{mount}$. The resistors $R_S$ as well as the resistor $R_S/2$ may each represent a portion of the resistance present in a post of the capacitor. The resistor $R_{bottom}$ may represent a portion of the resistance provided by bottom of a post, while the resistance $R_{mount}$ may represent a portion of the resistance provided by the soldering and pads to which the capacitor may be mounted. Analogous inductances may be represented by the similarly labeled inductors of rail circuit 501B.

In addition to the circuit model embodiments shown in FIGS. 7A and 7B, other embodiments are possible and contemplated. For example, embodiments of a circuit model wherein each of the rail circuits include a combination of both resistors and capacitors. In general, the available circuit models may be tailored to the specific types of capacitors used in the power distribution system for which a determination of decoupling capacitors is performed.

Figure 8A:
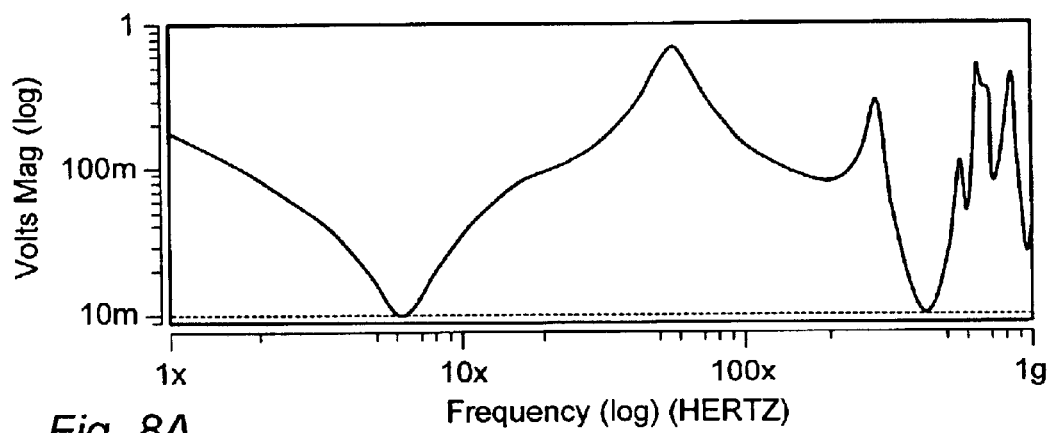
FIG. 8A is a graph illustrating the results of a board impedance simulation for a single capacitor, represented by one embodiment of the capacitor model, mounted to a printed circuit board.
Figure 8B:
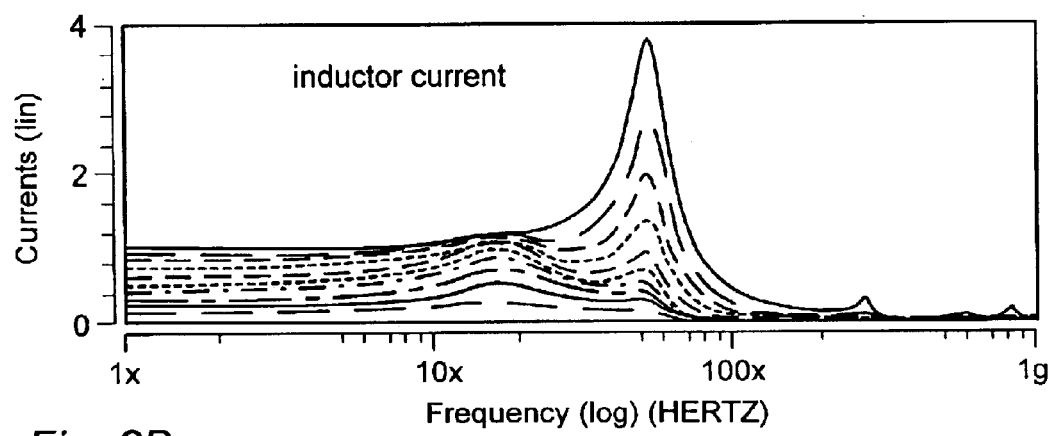
FIG. 8B is a graph illustrating the internal inductor currents for a simulation using one embodiment of the capacitor model.
Figure 8C:
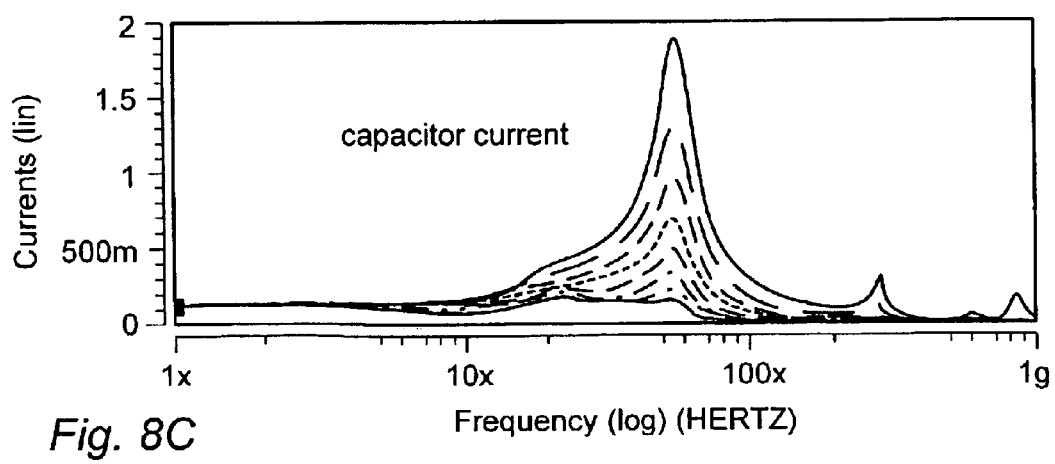
FIG. 8C is a graph illustrating the internal capacitor currents for a simulation using one embodiment of the capacitor model.

FIGS. 8A, 8B, and 8C—Simulated Impedance and Internal Capacitor Currents FIG. 8A is a graph illustrating the results of a board impedance simulation for a single capacitor, represented by one embodiment of the capacitor model of FIG. 7A, mounted to a printed circuit board. It should be noted here that the impedance is actually expressed as voltage magnitude. As shown herein, the graph of FIG. 8A illustrates the impedance characteristics over a wide frequency range. At the lower and middle frequencies, the simulation shows the circuit to have an impedance profile that is typical for a capacitor. At the low end of the frequency spectrum, the impedance is dominated by capacitive reactance, and decreases as frequency increases. As the frequency increases, the capacitor eventually reaches a state of resonance, at which the capacitive and inductive reactances cancel each other out. At this frequency, the impedance of the capacitor is its ESR, and may be purely resistive in nature. For frequencies above the resonant frequency, impedance is dominated by the inductive reactance, and increases proportionally with the frequency until reaching the first anti-resonant peak. This anti-resonant peak is a result of the dominance of inductive reactance of the circuit combined with the capacitance formed by the power and ground planes. Since the circuit is in a parallel configuration with respect to the power/ground plane combination (which in effect, forms a capacitor), a classic LC tank circuit having an impedance peak is formed. For frequencies above that at which the first anti-resonant peak occurs, several other peaks and valleys may be present as well, as shown in the graph.

FIG. 8B is a graph illustrating the internal inductor currents for a simulation using one embodiment of the capacitor model. The graph illustrates current vs. frequency for a plurality of the inductors of rail circuits 501A and 501B. Those inductors that are lower on rail circuits 501A and 501B have the highest current. The current is diminished for each successive inductor that is higher up one the rails.

With respect to frequency, the current through each of the inductors is relatively steady over the lower part of the frequency spectrum. As the frequency approaches the first parallel anti-resonant frequency, the current begins to increase, and peaks at a frequency that is approximately equal to the parallel anti-resonant frequency. For frequencies above the resonant frequency, the inductor currents tend to diminish rapidly.

FIG. 8C is a graph illustrating the internal capacitor currents for a simulation using one embodiment of the capacitor model. The graph illustrates current vs. frequency for a plurality of capacitors, wherein each of the capacitors is present on one of the rung circuits 505. At low frequencies, the current through each of the capacitors, is nearly identical for each of the capacitors. This is reflective of the current distribution of the actual capacitor that is modeled by ladder circuit 500. At low frequencies, when inductive reactance is at a minimum, current in the capacitor tends to distribute itself evenly along each of the plates in the capacitor. At the series resonant frequency, all capacitor plates are equally engaged with current. As the frequency increases towards the first parallel anti-resonant frequency, there is a sharp spike in the capacitor currents, with the capacitor of the lower rung circuits 505 carrying a majority of the current. Current then drops sharply for frequencies above the first parallel anti-resonant frequency.

Figure 3:
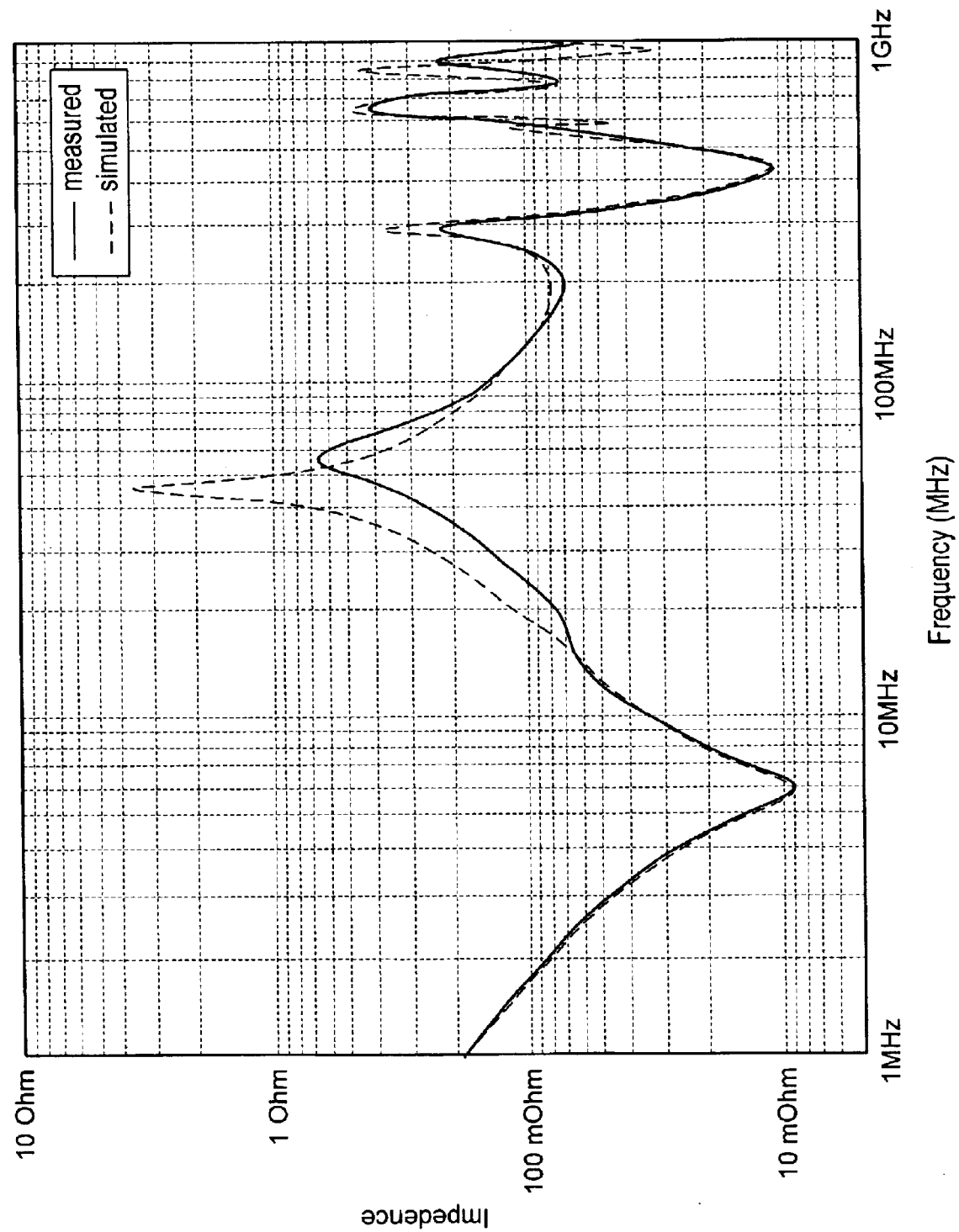
FIG. 3 (prior art) is a graph illustrating the simulated and measured performance of a capacitor mounted between two power planes over a range of frequencies, wherein the simulation is based on the traditional model of FIG. 2.
Figure 9A:
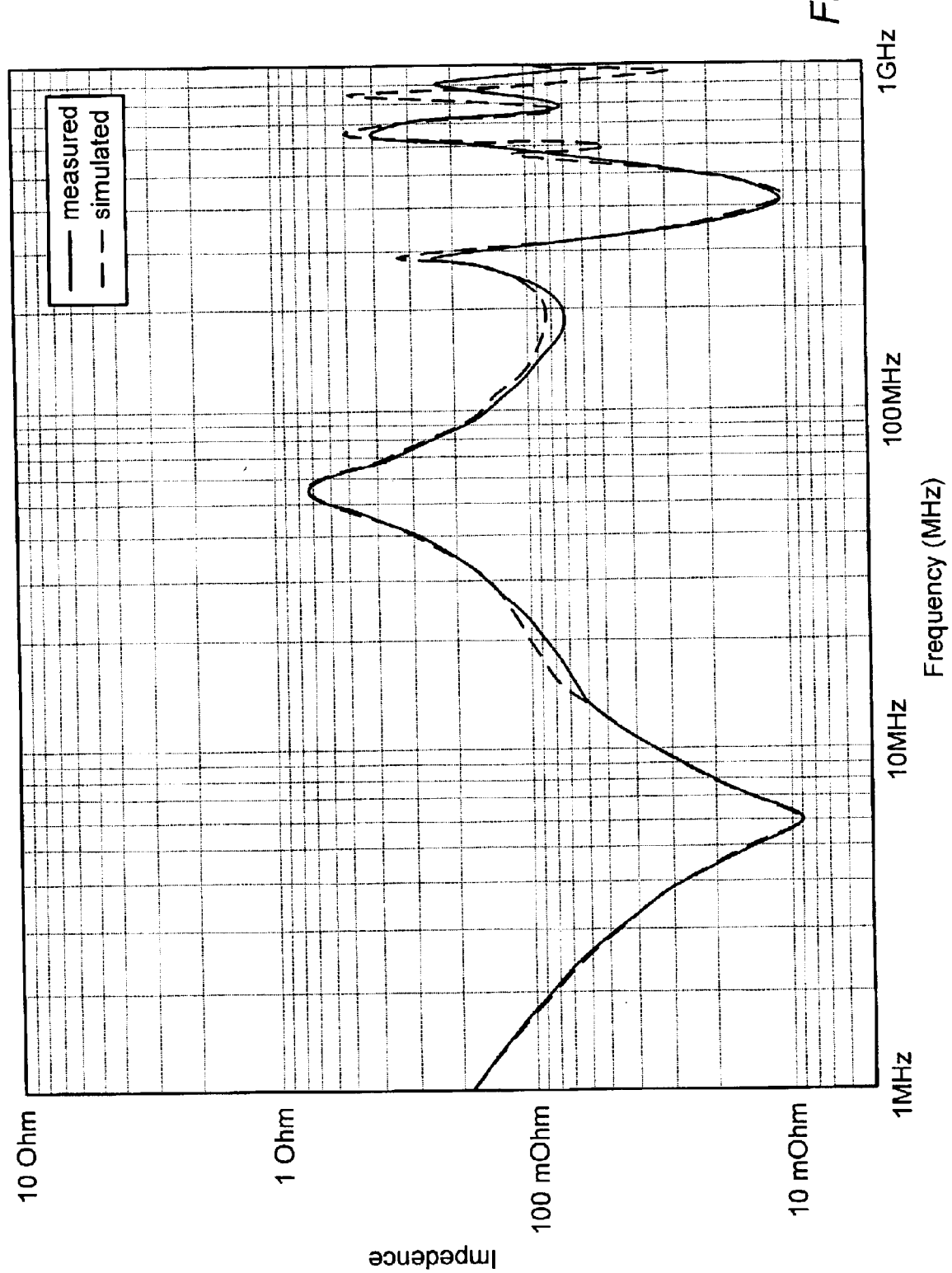
FIG. 9A is a graph of impedance vs. frequency illustrating the correlation between a simulation of one embodiment of the capacitor model and actual measured data.

At the parallel anti-resonant frequency, there is a large peak of current through both the inductors and capacitors. In the simulation from which the graphs were generated, one ampere of current was injected into a simulated PCB having a single capacitor represented by a SPICE model of ladder circuit 505. However, the current at the peak is nearly four amperes through the two inductors labeled $L_{bottom}$ in the circuit shown in FIG. 7. This is because charge is resonating back and forth between the PCB capacitance and the simulated discrete capacitor. As the frequency increases, a higher percentage of the current stays in the lower part of the capacitor, and similarly stays in the lower rungs of the ladder in ladder circuit 500. This is due to the increase in inductive reactance that occurs as frequency increases. As such, current is forced to stay in the lower part of the capacitor, and thus current is no longer evenly distributed among the capacitor plates—the current is now primarily distributed among the lower conductive plates, resulting in the current being forced to go through a higher resistance. This may result in the ESL of the capacitor decreasing as frequency increases, while the ESR of the capacitor increases as frequency increases FIG. 9A—Model to Hardware Correlation and illustration of LC Anti-resonant Peaks:

FIG. 9 is a graph of impedance vs. frequency illustrating the correlation between a simulation of one embodiment of the capacitor model and actual measured data. In the example shown, the measured (i.e. hardware) data is represented by a solid line, whereas the simulated (i.e. model) data is represented by a dashed line. As can be seen in the graph, there is a strong correlation between the measured data and the simulated data. The simulation was conducted using an embodiment of the model shown in FIG. 7. In contrast with the example shown in FIG. 3, there is a very strong correlation between the simulated and measured data, particularly at the first anti-resonant peak. As indicated by the graph, the model very accurately predicts both the frequency and magnitude of the first anti-resonant peak. It should be noted that the impedance peaks shown here are a result of LC resonances. Thus, various embodiments of the model may be effective in accurately predicting the frequency and amplitude of LC anti-resonant peaks. Effectiveness in predicting the frequency and amplitude of LC anti-resonant peaks may enhance the ability to suppress these peaks during the design of a power distribution system using the modeled capacitors.

Figure 9B:
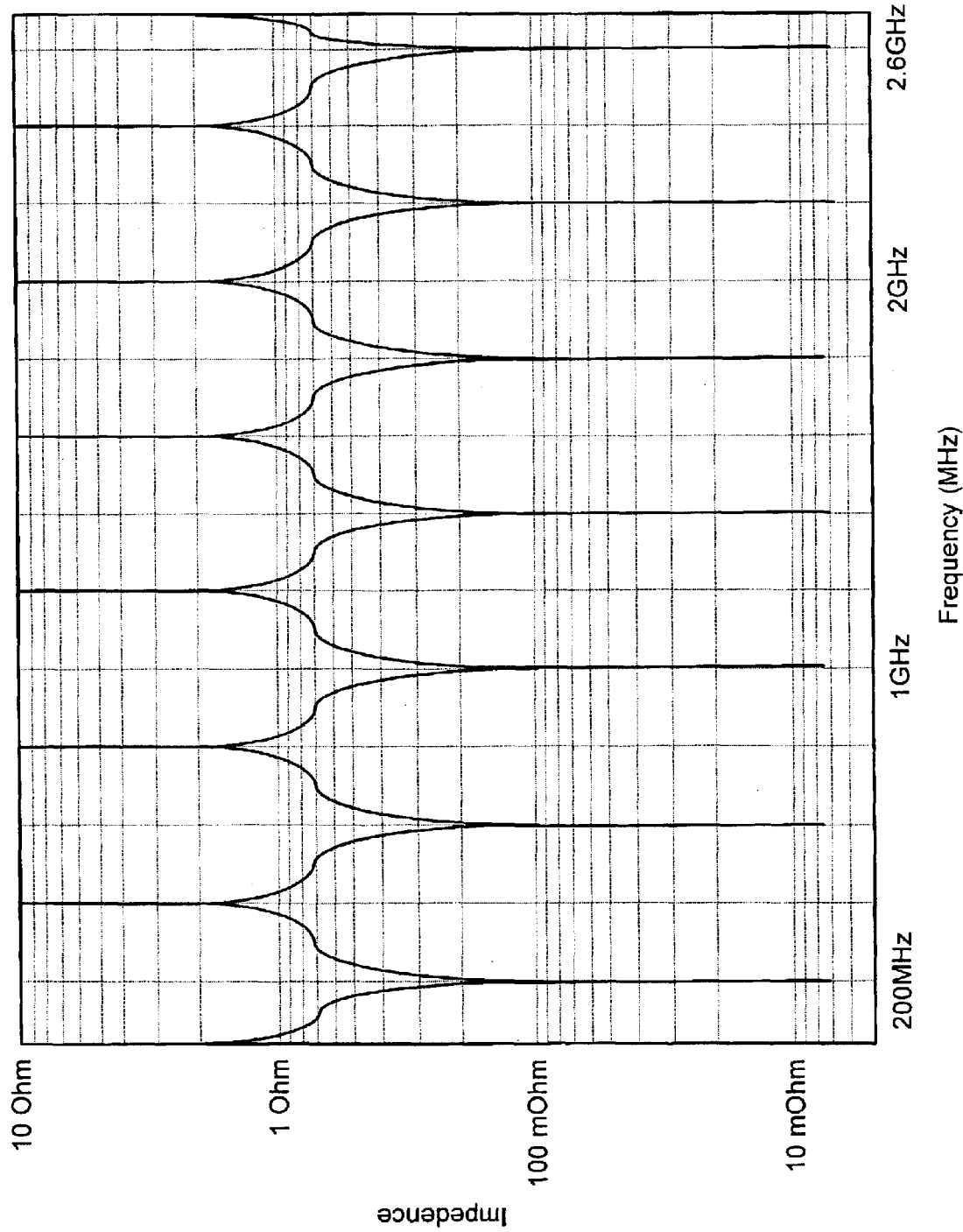
FIG. 9B is a graph of impedance vs. frequency illustrating a plurality of impedance peaks resulting from cavity resonances for one embodiment of a printed circuit board having power and ground planes.

FIG. 9B—Impedance vs. Frequency Graph Illustrating the Effects of Cavity Resonance FIG. 9B is a graph of impedance vs. frequency illustrating a plurality of impedance peaks resulting from cavity resonances for one embodiment of a printed circuit board having power and ground planes. The graph of FIG. 9B illustrates impedance peaks and valleys for an exemplary printed circuit board. In the embodiment shown, impedance peaks are present at 400 MHz, 800 MHz, 1.2 GHz, 1.6 GHz, 2 GHz, and 2.4 GHz. Impedance valleys are present in this example at 200 MHz, 600 MHz, 1 GHz, 1.4 GHz, 1.8 GHz, 2.2 GHz, and 2.6 GHz. These impedance peaks and valleys may be the result of standing waves at one or more physical locations on the printed circuit board. It should be noted that the graph presented herein may be a composite graph, and thus may show impedance peaks existing at different locations on the printed circuit board.

According to transmission line theory for standing waves, a minimum impedance for an open circuit ideal transmission line occurs at the frequency where a quarter of a wavelength resonates in the transmission line. A maximum impedance (infinite) exists in the transmission line where a half wavelength resonates. Thus, the impedance peaks here may be associated with half wavelengths of a system frequency, while the impedance valleys may be associated with quarter wavelengths. In order to achieve a target impedance across a wide frequency range, it may be necessary to suppress the impedance peaks. Placement of the decoupling capacitors may be important in suppressing the impedance peaks due to the fact that they are location specific. In particular, in order to suppress a given impedance peak resulting from a cavity resonance, a capacitor must be place at or near the point on the circuit board (or other type of circuit carrier) where the impedance peak occurs. It should also be noted that the selection of capacitors for the purpose of suppressing LC resonant impedance peaks may affect the location, frequency and/or amplitude where impedance peaks resulting from cavity resonances occur. In addition, the placement of capacitors to suppress impedance peaks resulting from cavity resonances may affect the location, frequency and/or amplitude of other impedance peaks resulting from the cavity resonances.

Figures 10A, 10B:
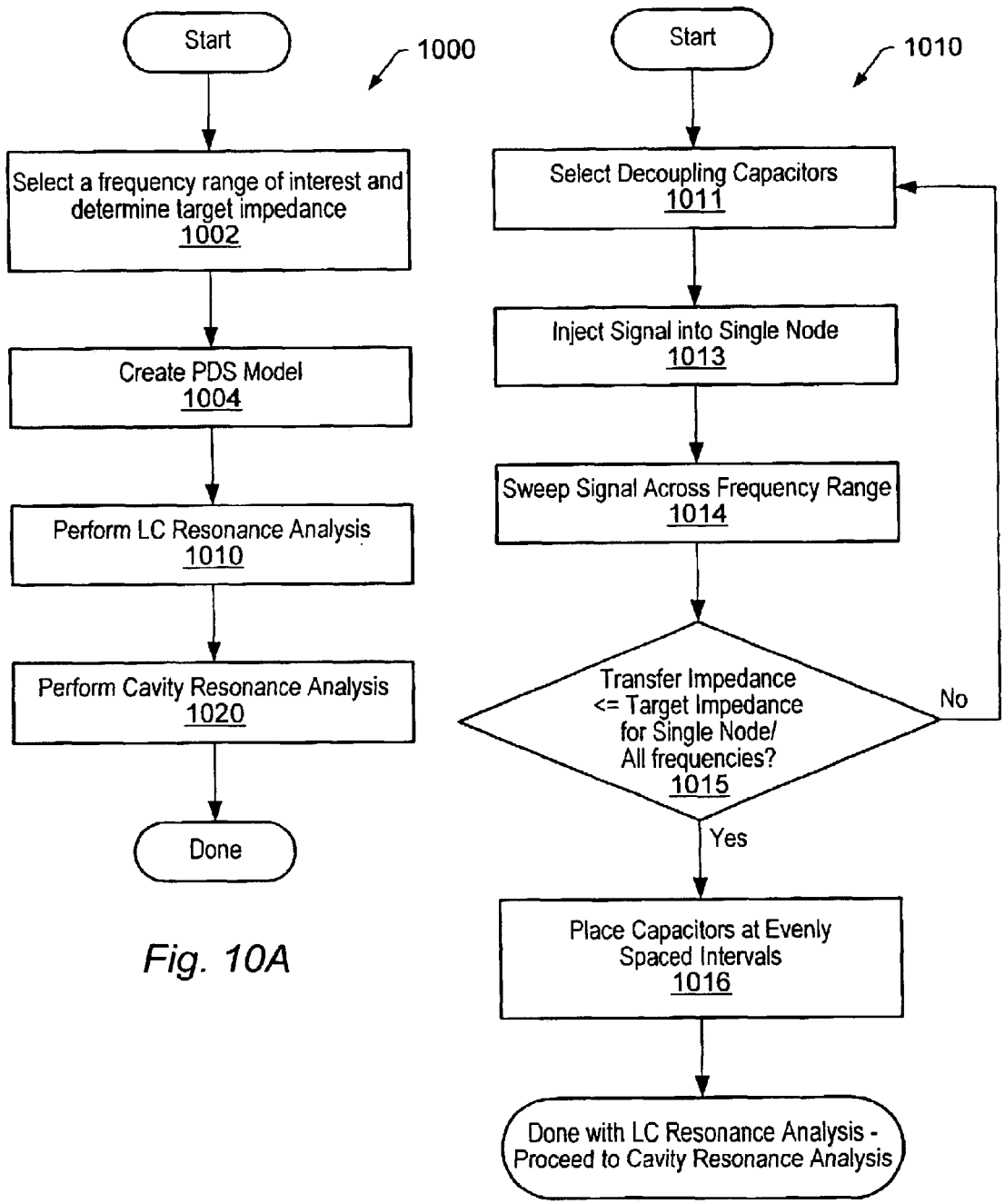
FIG. 10A is a flowchart of one embodiment of a method for determining the required decoupling capacitors for a power distribution system.
FIG. 10B is a flowchart of one embodiment of a method for determining the required decoupling capacitors for suppressing impedance peaks resulting from LC resonances.
Figure 10C:
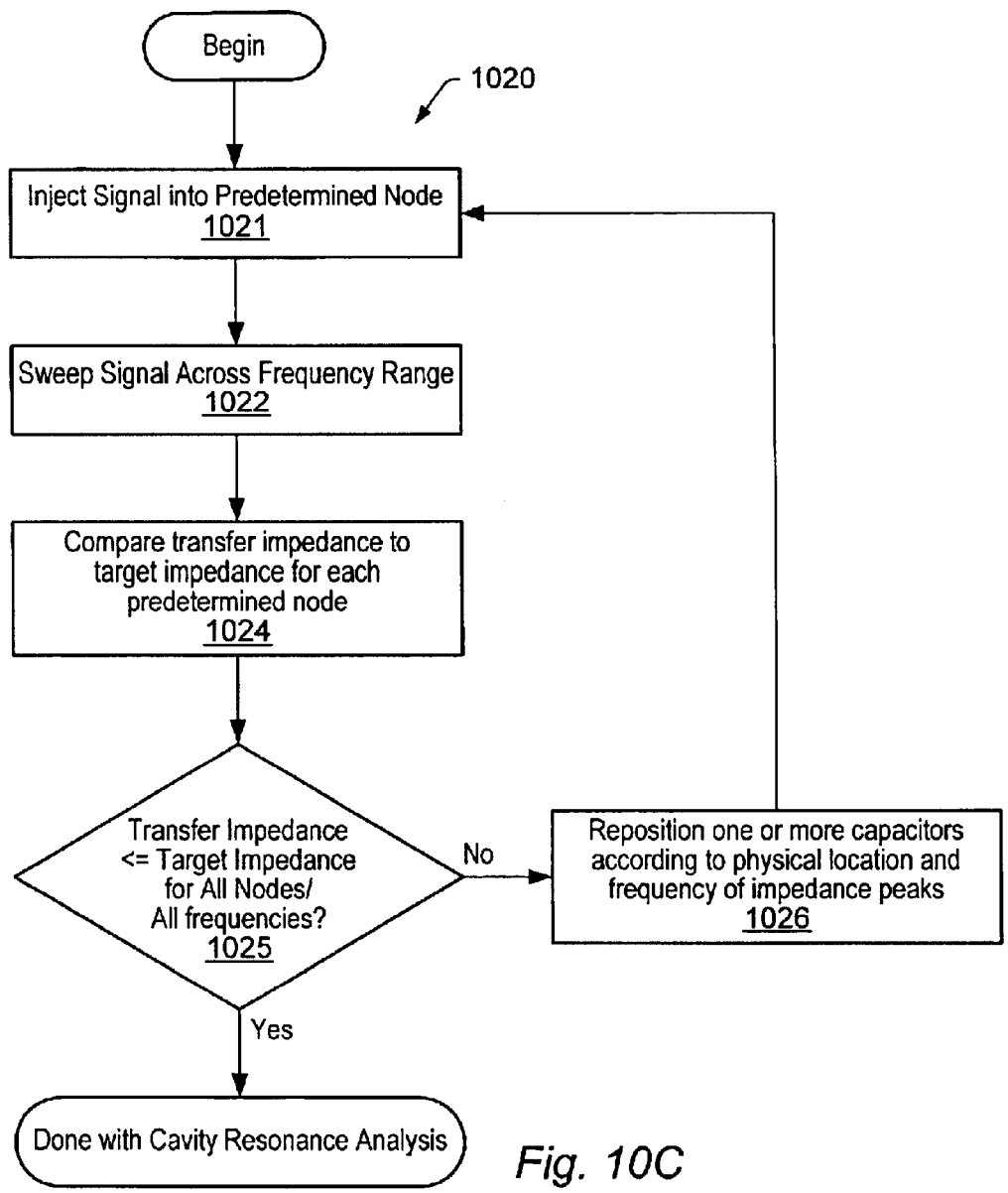
FIG. 10C is a flowchart of one embodiment of a method for determining the required decoupling capacitors and their respective locations for suppressing impedance peaks resulting from cavity resonances.

FIGS. 10A, 10B and 10C—Method for Determining the Required Decoupling Capacitors for a Power Distribution System FIGS. 10A, 10B and 10C illustrate one embodiment of a method determining the required decoupling capacitors for a power distribution system. The method may include determining the physical placement of each capacitor within the power distribution system. FIG. 10A is a general flowchart illustrating one embodiment the overall method for determining the required decoupling capacitors. FIG. 10B illustrates one embodiment of a method for performing an LC (inductive-capacitive) analysis for the power distribution system. FIG. 10C illustrates one embodiment of a method for performing a cavity resonance analysis for the power distribution system.

Moving now to FIG. 10A, a flowchart of one embodiment of a method for determining the required decoupling capacitors for a power distribution system is shown. Method 1000 may begin with the selection of a frequency range of interest and a target impedance. Selection of the frequency range of interest may be based on several factors. These factors may include various clock frequencies that may be present in the system for which the power distribution system is to be designed, harmonics of the clock frequencies, and frequency content of switching signals. The frequency content of switching signals may be found using the formula:

$$F = \frac{0.35}{T_{Rise}},$$

where is the frequency content of the switching signal, and $T_{Rise}$ is the rise time of the signal when switching from a low voltage level to a high voltage level. As the operating voltages of electronic systems becomes lower, this frequency tends to become higher as low voltage systems typically have smaller rise times than systems operating at higher voltages.

In general, a system designer may decide upon a frequency range based on one of the important system frequencies. A frequency range of interest may extend from 0 Hz (DC) up to the highest frequency of interest. The power distribution system may then be designed with a goal of meeting target impedance requirements within the selected frequency range.

The target impedance may be selected based on several different factors. In one embodiment, the target impedance may be constant throughout the frequency range of interest, and may be calculated by the formula:

$$Z_T = \frac{V \times \text{Ripple}}{I},$$

where $Z_T$ is the target impedance, V is the power supply voltage for the power distribution system, Ripple is the allowable tolerance, and I is the maximum amount of current from the power supply. As an example, the target impedance for a power distribution system having a power supply having a rated supply voltage of 1.6 volts, a rated current capacity of 20 amperes and a tolerance of ±5% would be 4 milliohms using the above formula.

Embodiments are also possible and contemplated wherein the target impedance is a function of frequency. The function may be a continuous function or a step function. Mathematical equations used to derive the target impedance may vary depending upon the parameters of the system for which the power distribution system is to be designed.

The method further contemplates the creation of a power distribution system model (item 1004). The model may be a model similar to that discussed in reference to FIGS. 4A and 4B. Creation of the power distribution system model may also include making an initial selection of decoupling capacitors for the power distribution system. The modeling of individual capacitors may take on one of several different forms, including that which is discussed in reference to FIG. 7. Although embodiments using the standard RLC model for each capacitor are possible an contemplated, the use of capacitor models based on the principles illustrated in FIG. 7 may allow for more accurate prediction of an impedance profile, particularly the prediction of the frequency and amplitude of the anti-resonant peaks.

With the initial modeling of the power distribution system complete, an LC (inductive capacitive) resonance analysis and a cavity resonance analysis (items 1010 and 1020, respectively) may be performed. The LC resonance analysis may include obtaining a profile of impedance vs. frequency for a single node of the power distribution system, determining the location of anti-resonant impedance peaks, and changing the capacitor selection in order to suppress these peaks. This may be repeated until the impedance of the power distribution system is at or below the target impedance for all desired frequencies.

The cavity resonance analysis may include obtaining a profile of impedance vs. frequency for specific locations within the power distribution system. For example, if the power distribution system includes a printed circuit board having planar conductors (i.e. power and ground planes), the cavity resonance analysis may determine an impedance profile for one or more locations on the printed circuit board. As previously noted, cavity resonance may be affected by the geometry of a printed circuit board (or other type of circuit carrier), as standing waves may develop at locations corresponding to the wavelengths of harmonics or subharmonics of a fundamental frequency. This may result in the occurrence of impedance peaks or impedance valleys at specific locations in the power distribution system. Thus, the physical location of specific capacitors may take on added importance in suppressing the impedance peaks resulting from cavity resonances.

While it is possible and contemplated that these analysis steps may be performed in either order, it is important to understand that designing the power distribution system to suppress impedance peaks resulting from one type of resonance may have certain effects when designing to suppress impedance peaks resulting from another type of resonance. In particular, designing to suppress impedance peaks resulting from LC resonances may cause the poles and zeros of the power distribution system to shift, which may result in impedance peaks resulting from cavity resonances changing in location, frequency, and/or amplitude. Thus, additional iterations of the cavity resonance analysis may be required if the LC resonance analysis is performed subsequent to an initial performance of the cavity resonance analysis.

Turning now to FIG. 10B, a flowchart of one embodiment of a method for determining the required decoupling capacitors for suppressing impedance peaks resulting from LC resonances is shown. LC resonance analysis method 1010 may include the selection of decoupling capacitors (item 1011). Decoupling capacitors may be selected from a database of decoupling capacitors having a wide variety of characteristics. These characteristics may include capacitance values, tolerances, and equivalent series resistance values. Other types of information may be present as well, such as size and shape of each capacitor and method of mounting the capacitor.

A single node analysis may be performed during the LC resonance analysis. The performance of a single node analysis includes the simulating of the operation of the capacitors at various frequencies with all of the capacitors connected in parallel. If the power distribution system includes a pair of planar conductors with a dielectric between them (e.g. a printed circuit board having one or more pairs of power and ground planes), the bulk capacitance of this arrangement may be factored in as well. Other parameters of a circuit carrier, PCB, or substrate as discussed in reference to FIGS. 4A and 4B, may be ignored during the LC resonance analysis since the primary focus is on the impedance peaks produced by the resonance of the inter-plane capacitance with the capacitor inductance. The capacitance resulting from power/ground plane combinations may be modeled in a manner similar to that of the capacitors, as described in FIG. 7. The modeling may include distributed capacitances, inductances, and equivalent series resistances, and may take into account the physical construction of power/ground plane combinations.

With the capacitors connected in parallel (as simulated), the method may simulate the injecting of a signal into a single node to which each of the capacitors is coupled (item 1013). The injected signal may then be swept across a frequency range (item 1014). In one embodiment, the frequency range which the signal is swept may begin at 0 Hz and end at an upper frequency selected during the determination of a frequency range of interest. For example, if the frequency range of interest extends from 0 Hz to 5 GHz, the signal may be injected into the node at 0 Hz and steadily increased until it reaches 5 GHz.

The simulated sweeping of an injected signal across a frequency range may produce a response at the node where the signal is injected. A transfer impedance value may be calculated for various frequencies based on the response generated by the injected signal. An impedance profile for the frequency range may be generated in order to illustrate the response. In one embodiment, a system configured to perform the method may produce a graph such as the one shown in FIG. 9A. Alternatively, the graph may show noise voltage (which is a product of impedance and current) instead of transfer impedance values. The data may also be presented in other formats, such as a tabular format showing an impedance or noise voltage level for a given frequency and/or the differential between the an impedance level and the target impedance. Using the graph or other data, a designer of the power distribution system may observe the data in order to determine where the impedance of the power distribution system exceeds the target impedance, taking particular note of the location of anti-resonant peaks. The data may be valid for any physical location in the power distribution system, and thus only a single node need be observed.

The impedance profile generated by sweeping the injected signal across the specified frequency range may be compared to the target impedance (item 1015). Particular notice may be given to the frequency and amplitude of the anti-resonant peaks. If the impedance of the power distribution system exceeds the target impedance for one or more points of the generated data, the method may return to item 1011 and reselect decoupling capacitors. Such reselecting may include selecting new capacitors, eliminating previously selected capacitors, or changing the quantity (increasing or decreasing) of previously selected decoupling capacitors. In particular, capacitors may be selected such that the series resonant frequency is at or near the frequency of an anti-resonant impedance peak. This may result in the impedance at that frequency being reduced to a level that is less than or equal to the ESR of the capacitors selected to eliminate the impedance peaks.

Following the reselecting of decoupling capacitors, the simulated injection and sweeping of a signal across a frequency range may be repeated. An impedance profile may again be generated, allowing the comparison of the transfer impedances to a target impedance for various frequencies. If one or more of the transfer impedances exceeds the target impedance, the reselecting of decoupling capacitors may be repeated again. In general, the method may cycle through a number of iterations, with each iteration adjusting the mix of capacitors until all of the calculated transfer impedances are at or below the target impedance.

Achieving the target impedance requirements during the performance of the LC resonance analysis may result in establishing a baseline for the mix of decoupling capacitors to be used in the power distribution system. Once this mix of decoupling capacitors is established, the method may then simulate the physical placement of the capacitors in the power distribution system at evenly spaced intervals (item 1016), thereby updating the power distribution system model. Capacitors of any value for any particular electrical characteristic may be placed at any of the physical locations designated by performance of the method.

FIG. 10C is a flowchart of one embodiment of a method for determining the required decoupling capacitors and their respective locations for suppressing impedance peaks resulting from cavity resonances. Method 1020 may begin with the power distribution model as updated by performing an LC resonance analysis as described above. The model may include the plurality of decoupling capacitors selected by the method and placed in the power distribution system at evenly spaced intervals. The model may also include a plurality of cells as shown in the embodiments illustrated in FIGS. 4A and 4B. Each of the predetermined nodes represented by one of the plurality of cells may correspond to a particular physical location in the power distribution system.

In contrast to the single node analysis performed by method 1010, method 1020 contemplates a multi-node analysis. As previously noted, cavity resonances may produce impedance peaks that are specific to a particular physical location within a power distribution system. Thus, for the cavity resonance analysis, it may be important to use the full model and analyze the target impedance a number of different physical locations throughout the power distribution system.

As with the LC resonance analysis, the cavity resonance analysis may be initiated by simulating the injection of a signal into a predetermined node and sweeping the signal across a frequency range (items 1021 and 1022, respectively). Using a comprehensive model of the power distribution system, the simulated sweeping of the injected signal may generate a response at each of the predetermined nodes. A profile of impedance vs. frequency for each of the predetermined nodes may be generated responsive to the sweeping of the injected signal. The impedance profile for each node may be presented in one or more different ways, including presentation as a graph or as tabulated data. Embodiments are also possible and contemplated wherein composite impedance profiles for multiple nodes are presented, illustrating impedance vs. frequency for a plurality of physical locations.

The generated impedance profiles may be used to compare the impedance at the physical locations (each corresponding to one of the predetermined nodes) to the target impedance (item 1024). Each impedance profile generated during the multi-node analysis may be examined for impedance peaks that occur as a result of cavity resonances. As previously noted, these impedance peaks may be confined to a certain area at or near locations represented by one of the predetermined nodes in the model. In order to suppress impedance peaks occurring at a particular location in the power distribution, the method may simulate moving a capacitor into a position at or near the physical location where the impedance peak occurs (item 1026). In one embodiment, the method may simulate moving the nearest capacitor having a series resonant frequency that most closely matches the frequency of the impedance peak to a location at or near where the impedance peak occurs. This repositioning may be performed for one or more decoupling capacitors in the power distribution system.

Repositioning a capacitor in order to suppress an impedance peak may cause shifts in other impedance peaks with respect to both frequency and physical location. Thus, a designer of a power distribution system using this method may need to make a determination as to the order in which the various impedance peaks must be addressed. In some embodiments, the use of a ranking function is contemplated. The ranking function may aid in determining the order in which capacitors should be repositioned in order to effectively suppress all of the cavity resonances. In one particular embodiment, the ranking function may be $$\text{Rank} = \frac{1}{f_{res}} * voltage_{fres} * \text{clk\_weight},$$

where $f_{res}$ is the series resonant frequency for a capacitor, $voltage_{fres}$ is the power distribution system noise (measure in volts) produced at the series resonant frequency, and clk_weight is a term yielding a relative importance of a system clock frequency and associated harmonics.

The ranking function shown above may give primary importance to impedance peaks occurring at lower frequencies. This is due to the presence of the reciprocal of the resonant frequency term ($f_{res}$). It is noted that repositioning capacitors in order to suppress impedance peaks occurring at lower frequencies may cause shifts in both frequency and physical location for impedance peaks occurring at higher frequencies. The repositioning of capacitors to suppress impedance peaks at higher frequencies may have less effect, if any, on the location, frequency, or amplitude of the lower frequency impedance peaks. Thus, in one embodiment, suppression of the lower frequency impedance peaks may be address before the higher frequency impedance peaks.

The ranking function may also give importance to the actual transfer impedance measured for a given frequency, as noted by the voltage$_{fres}$ term. This term may indicate the amount of noise, and thus the impedance, that is present at a predetermined node for a resonant frequency. This may emphasize a higher priority on suppressing impedance peaks having a higher amplitude.

Clock weight is another term that may aid in determining rankings for which capacitors should be repositioned first. The clock weight term gives importance to both a clock frequency and clock harmonic frequencies, and may take on added importance in systems where multiple clock signals are present. The clock weight term may be determined by a clock weight function:

$$\text{clk\_weight} = 1 + A * \left\{ \frac{2}{[1+(f_{clk}-f_{res})^2]} + \frac{1}{[1+(2*f_{clk}-f_{res})^2]} + \frac{0.5}{[1+(3*f_{clk}-f_{res})^2]} \right\},$$

wherein $f_{clk}$ is the clock frequency, $f_{res}$ is the resonance frequency for the capacitor to be ranked, and A is the importance factor for the clock (default value=1). The importance factor of the clock may be determined by a system designer, and may allow emphasis to be placed on frequencies related to certain clock frequencies which may play a more significant role in system operation with respect to other clock frequencies.

It should be noted with respect to the ranking and clock weight functions shown above that other embodiments are possible and contemplated. The functions shown herein may be appropriate for certain power distribution system designs, although other functions may be more appropriate for other designs.

Due to the fact that the repositioning of capacitors to suppress impedance peaks may cause shifts in the frequency and position of other impedance peaks, the repositioning performed in item 1026 may not involve all capacitors or attempt to suppress all of the impedance peaks. Following the repositioning of one or more capacitors, the method may be repeated by simulating the injecting of a signal into a predetermined node, sweeping the signal across a frequency range, and comparing the transfer impedances for each of the predetermined nodes at various frequencies. Additional capacitors may be repositioned in order to suppress the resonance peaks not addressed by earlier iterations. As with the LC resonance analysis, multiple iterations may be performed until transfer impedances for all nodes and all frequencies are at or below the target impedance.

It should be noted that, during the performance of the cavity resonance analysis, it may be possible to reselect or change the mix of decoupling capacitors present in the system. However, changing the selection or mix of decoupling capacitors may affect the resonances between the inter-plane capacitance and capacitor inductance, and thus it may be required to perform the LC analysis again, followed by re-performing the cavity resonance analysis.

Figure 11:
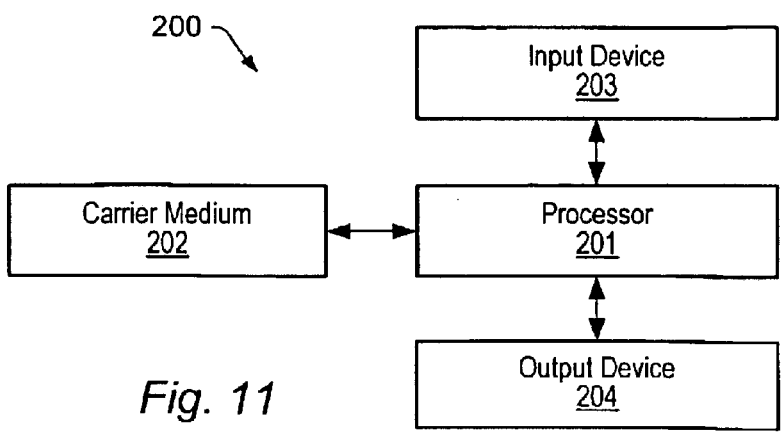
FIG. 11 is a block diagram of one embodiment of a computer system which may be used to implement for determining decoupling capacitors.

FIG. 11—Computer System for Implementing the Method

FIG. 11 is a block diagram of one embodiment of a computer system which may be used to implement a method for determining decoupling capacitors. Computer system 200 may be configured to implement the method of FIGS. 10A, 10B, and 10C, and may be further configured to implement various other methods utilizing the models of FIGS. 4, 5, and 7. Computer system 200 includes a processor 201 coupled to an input device 203, an output device 204, and a carrier medium 202.

Processor 201 may be a processor configured for executing instructions received from carrier medium 202 or other device. Processor 201 may further be configured to commit results of executed instructions to carrier medium 202 or output device 203. Processor 201 may be any type of processor architecture, such as complex instruction set (CISC) or reduced instruction set (RISC). In some embodiments, computer system 200 may include multiple instances of processor 201. Such embodiments may be configured for parallel processing of various software programs.

Generally speaking, a carrier medium 202 may include storage media (e.g. hard disk storage or floppy disk storage) or memory media such as magnetic or optical media, e.g., disk or CD-ROM (compact disk read only memory), volatile or non-volatile media such as various types of random access memory (RAM) including DRAM, SRAM, SDRAM, RDRAM, read-only memory (ROM), and flash memory. Media may also include flash memory, CD-ROM (compact disc ROM), and DVD-ROM (digital versatile disk ROM). Carrier media may also include transmission media or signals such as electrical, electromagnetic, or digital signals, conveyed via a communication medium such as a network and/or wireless link. Computer system 200 may include multiple instances of carrier medium 202, which may be implemented in the various forms described herein. In one embodiment, carrier medium 200 may be used to store instructions of a circuit simulation software program, such as SPICE. In another embodiment, one of several different types of commercially available mathematical software packages may be stored in carrier medium 200.

The instructions stored in carrier medium 202 may be executed by processor 201, with the results forwarded back to carrier medium 202, an output device 204, or both. The execution of the instructions may also prompt a user for additional inputs through input device 203.

Input device 203 may be one or more of several different input devices, such as a keyboard, a mouse, a touch-screen monitor, a floppy disk device, and any of the devices listed as carriers above. Results obtained by performing the method using computer system 200 may be forwarded to an output device 204. Output device 204 may be one or more of several different output devices, such as a monitor, a printer, and any of the devices listed above a carriers. It should also be noted that a network interface card may be used in this embodiment as an input device, and output device, or a carrier medium, and further, that computer system 200 may perform various embodiments of the method in conjunction with other computer systems to which it is connected to via a computer network. Thus, in some embodiments, the various methods described herein may be performed by a local computer and one or more remote computers coupled to the local computer.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A method for determining the required decoupling capacitors for a power distribution system, the method comprising:

determining a target impedance;

creating a power distribution system model, wherein said creating includes selecting a plurality of decoupling capacitors for the power distribution system;

performing an LC (inductive-capacitive) resonance analysis, wherein said performing the LC resonance analysis includes simulating an injection of a signal at a single node, wherein each of the capacitors is electrically connected to the single node and a ground node, simulating the sweeping of the signal across a frequency range, comparing first transfer impedance values to the target impedance for one or more frequencies at the single node, repeating said sweeping, said selecting, and said comparing first transfer impedance values until each of the first transfer impedance values is less than or equal to the target impedance;

simulating the positioning of each of the plurality of decoupling capacitors at evenly spaced intervals in the power distribution system; and performing a cavity resonance analysis, wherein said performing the cavity resonance analysis includes comparing second transfer impedance values to the target impedance for one or more frequencies at a plurality of nodes, repositioning one or more of the plurality of decoupling capacitors, repeating said comparing second transfer impedance values and said repositioning until each of the second transfer impedance values is less than or equal to the target impedance.

2. The method as recited in claim 1, wherein said performing the LC resonance analysis further includes:

calculating transfer impedance values at the single node for one or more frequencies in the frequency range.

3. The method as recited in claim 1, wherein said performing the LC resonance analysis further includes adding additional decoupling capacitors.

4. The method as recited in claim 1, wherein the power distribution system model includes a plurality of cells interconnected at predetermined nodes.

5. The method as recited in claim 4, wherein said performing the cavity resonance analysis includes:

simulating the injection of a signal at one of the predetermined nodes;

simulating the sweeping of the signal across a frequency range; and calculating transfer impedance values at each of the predetermined nodes for one or more frequencies in the frequency range.

6. The method as recited in claim 5, wherein said comparing second transfer impedance values includes comparing transfer impedance values to the target impedance for each of the predetermined nodes.

7. The method as recited in claim 6, wherein said performing the cavity resonance analysis further includes determining a frequency and physical location of a first impedance peak, wherein said repositioning includes changing the simulated physical location of a first decoupling capacitor to the physical location of the first impedance peak, wherein the series resonant frequency of the first capacitor is approximately the same as the frequency of the first impedance peak.

8. The method as recited in claim 7, wherein said performing the cavity resonance analysis further include determining a frequency and physical location of a second impedance peak, wherein said repositioning includes changing the simulated physical location of a second decoupling capacitor to the physical location of the second impedance peak, wherein the series resonant frequency of the second capacitor is approximately the same as the frequency of the second impedance peak.

9. The method as recited in claim 8, wherein the frequency of the second impedance peak is greater than the frequency of the first impedance peak.

10. The method as recited in claim 8, wherein the first impedance peak and the second impedance peak are each given a rank, wherein the rank of each of the first and second impedance peaks is determined by a ranking function.

11. The method as recited in claim 4, wherein the plurality of cells is arranged in an M×N grid.

12. The method as recited in claim 11, wherein M and N are integers of equal value.

13. The method as recited in claim 4, wherein the power distribution system includes a power supply, and wherein the power distribution system model includes attributes of the power supply, said attributes including a voltage rating, a current rating, one or more pole frequencies, one or more zero frequencies, and one or more resistances.

14. The method as recited in claim 1, wherein each of the plurality of decoupling capacitors is represented by a capacitor model.

15. The method as recited in claim 14, wherein the capacitor model is a mathematical model of an electric circuit, the circuit comprising:

a first rail circuit and a second rail circuit, the first rail and the second rail circuit each comprising a plurality of circuit elements in a series configuration; and a plurality of rung circuits, each rung circuit comprising a resistor and a capacitor in a series configuration, and wherein each rung circuit is arranged to electrically connect the first rail circuit and the second rail circuit at distinct nodes.

16. The method as recited in claim 15, wherein the first rail circuit comprises a plurality of resistors in a series configuration and the second rail circuit comprises a plurality of inductors in a series configuration.

17. The method as recited in claim 15, wherein the first rail circuit and the second rail circuit each comprise a plurality of inductors in a series configuration.

18. The method as recited in claim 15, wherein the first rail circuit represents a first post of a capacitor and the second rail circuit represents a second post of the capacitor.

19. The method as recited in claim 18, wherein the capacitor includes a plurality of plates connected to the first post and a plurality of plates connected to the second post, and further includes a dielectric material arranged between each of the plurality of plates, and wherein the number of rung circuits is approximately equal to the number of plates.

20. The method as recited in claim 18, wherein the plurality of circuit elements includes a plurality of inductors, and wherein each of the plurality of inductors represent a portion of the equivalent series inductance of the capacitor.

21. The method as recited in claim 15, wherein the plurality of circuit elements includes a plurality of resistors, and wherein each of the plurality of resistors represents a portion of the equivalent series resistance of the capacitor.

22. The method as recited in claim 15, wherein each resistor of the plurality of rung circuits represents a portion of the equivalent series resistance of the capacitor.

23. The method as recited in claim 15, wherein the capacitor in each of the plurality of rung circuits represents a portion of the capacitance of the capacitor.

24. The method as recited in claim 1, wherein the target impedance is constant over a frequency range of interest.

25. The method as recited in claim 1, wherein the target impedance is a function of frequency.

26. A system for determining the required decoupling capacitors for a power distribution system, the system comprising:
a computer system configured to:
determine a target impedance;
create a power distribution system model, wherein creating the power distribution system model includes selecting a plurality of decoupling capacitors for the power distribution system;
perform an LC (inductive-capacitive) resonance analysis, wherein said performing the LC resonance analysis includes simulating an injection of a signal at a single node, wherein each of the decoupling capacitors is electrically connected to the single node and a ground node, simulating the sweeping of the signal across a frequency range, comparing first transfer impedance values to the target impedance for one or more frequencies at the single node, repeating said sweeping, said selecting, and said comparing first transfer impedance values until each of the first transfer impedance values is less than or equal to the target impedance;
simulate the positioning of each of the plurality of decoupling capacitors at evenly spaced intervals in the power distribution system; and
perform a cavity resonance analysis, wherein performing the cavity resonance analysis includes comparing second transfer impedance values to the target impedance for one or more frequencies at a plurality of nodes, repositioning one or more of the plurality of decoupling capacitors, repeating said comparing second transfer impedance values and said repositioning until each of the second transfer impedance values is less than or equal to the target impedance.

27. The system as recited in claim 26, wherein performing the LC resonance analysis further includes:
calculating transfer impedance values at the single node for one or more frequencies in the frequency range.

28. The system as recited in claim 26, wherein performing the LC resonance analysis further includes adding decoupling capacitors.

29. The system as recited in claim 26, wherein the power distribution system model includes a plurality of cells interconnected at predetermined nodes.

30. The system as recited in claim 29, wherein performing the cavity resonance analysis includes:
simulating the injection of a signal at one of the predetermined nodes;
simulating the sweeping of the signal across a frequency range; and
calculating transfer impedance values at each of the predetermined nodes for one or more frequencies in the frequency range.

31. The system as recited in claim 30, wherein said comparing second transfer impedance values includes comparing transfer impedance values to the target impedance for each of the predetermined nodes.

32. The system as recited in claim 31, wherein performing the cavity resonance analysis further includes determining a frequency and physical location of a first impedance peak, wherein said repositioning includes changing the simulated physical location of a first decoupling capacitor to the physical location of the first impedance peak, wherein the series resonant frequency of the first capacitor is approximately the same as the frequency of the first impedance peak.

33. The system as recited in claim 32, wherein performing the cavity resonance analysis further include determining a frequency and physical location of a second impedance peak, wherein said repositioning includes changing the simulated physical location of a second decoupling capacitor to the physical location of the second impedance peak, wherein the series resonant frequency of the second capacitor is approximately the same as the frequency of the second impedance peak.

34. The system as recited in claim 33, wherein the frequency of the second impedance peak is greater than the frequency of the first impedance peak.

35. The system as recited in claim 33, wherein the first impedance peak and the second impedance peak are each given a rank, wherein the rank of each of the first and second impedance peaks is determined by a ranking function.

36. The system as recited in claim 29, wherein the plurality of cells is arranged in an M×N grid.

37. The system as recited in claim 36, wherein M and N are integers of equal value.

38. The system as recited in claim 29, wherein the power distribution system includes a power supply, and wherein the power distribution system model includes attributes of the power supply, said attributes including a voltage rating, a current rating, one or more pole frequencies, one or more zero frequencies, and one or more resistances.

39. The system as recited in claim 26, wherein each of the plurality of decoupling capacitors is represented by a capacitor model.

40. The system as recited in claim 39, wherein the capacitor model is a mathematical model of an electric circuit, the circuit comprising:
a first rail circuit and a second rail circuit, the first rail and the second rail circuit each comprising a plurality of circuit elements in a series configuration; and
a plurality of rung circuits, each rung circuit comprising a resistor and a capacitor in a series configuration, and wherein each rung circuit is arranged to electrically connect the first rail circuit and the second rail circuit at distinct nodes.

41. The system as recited in claim 40, wherein the first rail circuit comprises a plurality of resistors in a series configuration and the second rail circuit comprises a plurality of inductors in a series configuration.

42. The system as recited in claim 40, wherein the first rail circuit and the second rail circuit each comprise a plurality of inductors in a series configuration.

43. The system as recited in claim 40, wherein the first rail circuit represents a first post of a capacitor and the second rail circuit represents a second post of the capacitor.

44. The system as recited in claim 43, wherein the capacitor includes a plurality of plates connected to the first post and a plurality of plates connected to the second post, and further includes a dielectric material arranged between each of the plurality of plates, and wherein the number of rung circuits is approximately equal to the number of plates.

45. The system as recited in claim 40, wherein the plurality of circuit elements includes a plurality of inductors, and wherein each of the plurality of inductors represents a portion of the equivalent series inductance of the capacitor.

46. The system as recited in claim 40, wherein the plurality of circuit elements includes a plurality of resistors, and wherein each of the plurality of resistors represents a portion of the equivalent series resistance of the capacitor.

47. The system as recited in claim 40, wherein each resistor in the plurality of rung circuits represents a portion of the equivalent series resistance of the capacitor.

48. The system as recited in claim 40, wherein the capacitor in each of the plurality of rung circuits represents a portion of the capacitance of the capacitor.

49. The system as recited in claim 26, wherein the target impedance is constant over a frequency range of interest.

50. The system as recited in claim in claim 26, wherein the target impedance is a function of frequency.

51. A carrier medium, the carrier medium configured for storing instructions that, when executed by a processor coupled to the carrier medium, perform a method for determining the required decoupling capacitors for a power distribution system, the method comprising:

determining a target impedance;

creating a power distribution system model, wherein said creating includes selecting a plurality of decoupling capacitors for the power distribution system;

performing an LC (inductive-capacitive) resonance analysis, wherein said performing the LC resonance analysis includes simulating an injection of a signal a single node, wherein each of the decoupling capacitors is electrically connected to the single node and a ground node, simulating the sweeping of the signal across a frequency range, comparing first transfer impedance values to the target impedance for one or more frequencies at the single node, repeating said sweeping, said selecting, and said comparing first transfer impedance values until each of the first transfer impedance values is less than or equal to the target impedance;

simulating the positioning of each of the plurality of decoupling capacitors at evenly spaced intervals in the power distribution system; and performing a cavity resonance analysis, wherein said performing the cavity resonance analysis includes comparing second transfer impedance values to the target impedance for one or more frequencies at a plurality of nodes, repositioning one or more of the plurality of decoupling capacitors, repeating said comparing second transfer impedance values and said repositioning until each of the second transfer impedance values is less than or equal to the target impedance.

52. The carrier medium as recited in claim 51, wherein performing the LC resonance analysis further includes:

calculating transfer impedance values at the single node for one or more frequencies in the frequency range.

53. The carrier medium as recited in claim 51, wherein performing the LC resonance analysis further includes adding decoupling capacitors.

54. The carrier medium as recited in claim 51, wherein the power distribution system model includes a plurality of cells interconnected at predetermined nodes.

55. The carrier medium as recited in claim 54, wherein said performing the cavity resonance analysis includes:

simulating the injection of a signal at one of the predetermined nodes;

simulating the sweeping of the signal across a frequency range; and calculating transfer impedance values at each of the predetermined nodes for one or more frequencies in the frequency range.

56. The carrier medium as recited in claim 55, wherein said comparing second transfer impedance values includes comparing transfer impedance values to the target impedance for each of the predetermined nodes.

57. The carrier medium as recited in claim 56, wherein said performing the cavity resonance analysis further includes determining a frequency and physical location of a first impedance peak, wherein said repositioning includes changing the simulated physical location of a first decoupling capacitor to the physical location of the first impedance peak, wherein the series resonant frequency of the first capacitor is approximately the same as the frequency of the first impedance peak.

58. The carrier medium as recited in claim 57, wherein said performing a cavity resonance analysis further include determining a frequency and physical location of a second impedance peak, wherein said repositioning includes changing the simulated physical location of a second decoupling capacitor to the physical location of the second impedance peak, wherein the series resonant frequency of the second capacitor is approximately the same as the frequency of the second impedance peak.

59. The carrier medium as recited in claim 58, wherein the frequency of the second impedance peak is greater than the frequency of the first impedance peak.

60. The carrier medium as recited in claim 58, wherein the first impedance peak and the second impedance peak are each given a rank, wherein the rank of each of the first and second impedance peaks is determined by a ranking function.

* * * * *

UNITED STATES PATENT AND TRADEMARK OFFICE
CERTIFICATE OF CORRECTION

PATENT NO. : 6,789,241 B2
DATED : September 7, 2004
INVENTOR(S) : Anderson et al.

It is certified that error appears in the above-identified patent and that said Letters Patent is hereby corrected as shown below:

Column 21,
Line 4, please insert -- decoupling -- after "wherein each of the".

Column 25,
Line 19, please replace "of a signal a" with -- of a signal at a --.

Signed and Sealed this

Fifteenth Day of March, 2005

JON W. DUDAS
*Director of the United States Patent and Trademark Office*